United States Patent
Kadota et al.

(10) Patent No.: US 12,334,900 B2
(45) Date of Patent: Jun. 17, 2025

(54) ACOUSTIC WAVE DEVICE

(71) Applicant: TOHOKU UNIVERSITY, Sendai (JP)

(72) Inventors: Michio Kadota, Sendai (JP); Shuji Tanaka, Sendai (JP)

(73) Assignee: TOHOKU UNIVERSITY, Sendai (JP)

( * ) Notice: Subject to any disclaimer, the term of this patent is extended or adjusted under 35 U.S.C. 154(b) by 335 days.

(21) Appl. No.: 17/801,886

(22) PCT Filed: Feb. 12, 2021

(86) PCT No.: PCT/JP2021/005129
§ 371 (c)(1),
(2) Date: Aug. 24, 2022

(87) PCT Pub. No.: WO2021/172032
PCT Pub. Date: Sep. 2, 2021

(65) Prior Publication Data
US 2023/0361752 A1    Nov. 9, 2023

(30) Foreign Application Priority Data
Feb. 28, 2020   (JP) .................................. 2020-034101

(51) Int. Cl.
*H03H 9/02*      (2006.01)
*H03H 9/145*     (2006.01)
*H03H 9/25*      (2006.01)

(52) U.S. Cl.
CPC ........ *H03H 9/02574* (2013.01); *H03H 9/145* (2013.01); *H03H 9/25* (2013.01)

(58) Field of Classification Search
CPC ....... H03H 9/02574; H03H 9/145; H03H 9/25
See application file for complete search history.

(56) References Cited

U.S. PATENT DOCUMENTS

| | | | |
|---|---|---|---|
| 5,838,090 A | * | 11/1998 | Nakahata ........... H03H 9/02582 310/313 A |
| 2011/0199168 A1 | * | 8/2011 | Kadota .................. H03H 9/542 333/195 |

(Continued)

FOREIGN PATENT DOCUMENTS

| | | |
|---|---|---|
| JP | H11-220352 A | 8/1999 |
| JP | 2011-015397 A | 1/2011 |

(Continued)

OTHER PUBLICATIONS

Overtones and Harmonics, Hyperphysics.phy-astr.gsu.edu, archived date of Apr. 8, 2022, https://web.archive.org/web/20220408112146/http://hyperphysics.phy-astr.gsu.edu/hbase/Music/otone.html (Year: 2022).*

(Continued)

*Primary Examiner* — Samuel S Outten
(74) *Attorney, Agent, or Firm* — Oliff PLC

(57) ABSTRACT

An acoustic wave device that can achieve a good characteristic in a superhigh frequency band of 6 GHz or higher by using an overtone. The device includes: a piezoelectric substrate; an electrode provided in such a way as to be in contact with the piezoelectric substrate; and an acoustic multilayer film provided in such a way as to be in contact with the piezoelectric substrate and/or the electrode and is configured to use an overtone of resonance characteristics of a surface acoustic wave. The electrode includes an interdigital transducer provided on one of surfaces of the piezoelectric substrate. The surface acoustic wave that is the overtone preferably has a velocity of 9000 m/s or higher. The acoustic multilayer film is preferably composed of an acoustic low impedance film and an acoustic high impedance film which are alternately stacked.

15 Claims, 12 Drawing Sheets

(56) References Cited

U.S. PATENT DOCUMENTS

| | | | | |
|---|---|---|---|---|
| 2012/0194032 A1* | 8/2012 | Kadota | ............. | H03H 9/02559 310/313 A |
| 2017/0288629 A1* | 10/2017 | Bhattacharjee | .... | H03H 9/02275 |
| 2021/0119600 A1* | 4/2021 | Makkonen | ......... | H03H 9/02228 |

FOREIGN PATENT DOCUMENTS

| | | | |
|---|---|---|---|
| JP | 2013-528996 A | 7/2013 | |
| JP | 5648695 B2 | 1/2015 | |
| JP | 2015-537492 A | 12/2015 | |
| JP | 2018-182615 A | 11/2018 | |
| WO | 2012/086441 A1 | 6/2012 | |
| WO | 2016-047255 A1 | 3/2016 | |
| WO | 2020-204045 A1 | 10/2020 | |

OTHER PUBLICATIONS

Kimura, T. et al., "3.5 GHZ longitudinal leaky surface acoustic wave resonator using a multilayered waveguide structure for high acoustic energy confinement," Japanese Journal of Applied Physics, vol. 57, 07LD15-1-07LD15-4, 2018. k.

Larson, J.D. et al., "Power Handling and Temperature Coefficient Studies in FBAR Duplexers for the 1900 MHz PCS Band," IEEE Ultrasonics Symposium, pp. 869-874, 2000.

Umeda, K. et al., "Piezoelectric Properties of ScAlN Thin Films, for Piezo-mems Devices," MEMS 2013, Jan. 20-24, 2013, Taipei, Taiwan, pp. 733-736.

Kadota, M. et al., "High-Frequency Lamb Wave Device Composed of MEMS Structure Using LiNbO3 Thin Film and Air Gap," IEEE Transactions on Ultrasonics, Ferroelectrics, and Frequency Control, vol. 57, No. 11, Nov. 2010, pp. 2564-2571.

Kadota, M. et al., Suprious-Free, Near-Zero-TCF Hetero Acoustic Layer (HAL) SAW Resonators Using LiTaO3 Thin Plate on Quartz, IEEE Ultrasonic Symposium, 2018.

Assila, N. et al., "High-Frequency Resonator Using A1 Lamb Wave Mode in LiTaO3 Plate," IEEE Transactions on Ultrasonics, Ferroelectrics, and Frequency Control, vol. 66, No. 9, Sep. 2019, pp. 1529-1535.

Kimura, T. et al., "S0 Mode Lamb Wave Resonators Using LiNbO3 Thin Plate on Acoustic Multilater Reflector," Japanese Journal of Applied Physics, vol. 52, 07HD03-1-07HD03-4, 2013.

Shimizu, Y., SAW propagation characteristics on LiTaO3 with arbitrary cut, Acoustical Society of Japan, pp. 140-145, 1980.

Mar. 30, 2021 International Search Report issued in International Patent Application No. PCT/JP2021/005129.

Aug. 30, 2022 International Preliminary Report on Patentability issued in International Patent Application No. PCT/JP2021/005129.

Jan. 14, 2025 Office Action issued in Taiwanese Patent Application No. 110131482.

* cited by examiner

ACOUSTIC WAVE DEVICE

FIELD OF THE INVENTION

The present invention relates to an acoustic wave device.

DESCRIPTION OF RELATED ART

A frequency band from 700 MHz to 3 GHz, which is mainly used for smartphones and the like, contains almost 80 bands and is very congested. To address this, a frequency band from 3.3 to 4.9 GHz is being used in the fifth generation mobile communication system (5G) and a plan to use a frequency band of 6 GHz or higher in the next generation is developed.

Conventionally, in the frequency band from 700 MHz to 3 GHz, a bulk acoustic wave (FBAR; Film Bulk Acoustic Resonator) device using an AlN or ScAlN piezoelectric thin film (see, for example, Non-Patent Literature 1 or 2) and a surface acoustic wave (SAW) device and a device using a longitudinal leaky surface acoustic wave (LLSAW), which use a LiNbO$_3$ crystal (LN) or a LiTaO$_3$ crystal (LT) as a piezoelectric substrate or a thin film, have been used (see, for example, Non-Patent Literature 3 or 4). In a surface acoustic wave (SAW) device, since a bandwidth depends on the electromechanical coupling coefficient (coupling coefficient) of a piezoelectric substrate that is used, a LN or LT substrate having a coupling coefficient necessary for the bandwidth is generally used.

In the FBAR device of these devices, since the AlN or ScAlN film, for example, is c-axis oriented, thickness longitudinal vibration is the only mode of vibration of a bulk wave that is used. The velocity of this longitudinal wave is expressed as $(c33^D/\text{density})^{1/2}$ ($c33^D$ is an elastic stiffness constant), and an exciting frequency is a frequency obtained by subtracting a reduction in a frequency due to the mass load of an electrode from a value expressed as velocity/(2× film thickness). This makes it necessary to extremely reduce the film thickness of the piezoelectric thin film in order to achieve a high exciting frequency. However, it is difficult for the FBAR device using AlN or ScAlN as the piezoelectric thin film to achieve a good characteristic because AlN and ScAlN are polycrystalline thin films and therefore considerably damped at superhigh frequencies.

Moreover, in the surface acoustic wave (SAW) device using LN or LT as the piezoelectric substrate, a frequency f is determined by f=V/λ from the velocity V of the substrate and the period (wavelength λ) of an interdigital transducer. Since the limit of the wavelength of the interdigital transducer is about 1.2 µm in connection with power handling and variations in the process of production, the limit of the frequency on the high-frequency side is about 3.2 GHz in connection with the velocity of the substrate that is used.

When a piezoelectric film such as ZnO is formed on a high sound speed substrate such as sapphire, a fundamental-mode Rayleigh wave (zero order) and a higher-order mode Sezawa wave (first order) and a still higher-order mode (second order, third order, . . . ) wave are excited depending on the thickness of the piezoelectric film, but the frequency of the higher-order mode is not an integral multiple of the frequency of the fundamental mode. On the other hand, in bulk wave thickness vibration, in addition to the fundamental mode, an overtone of a frequency (Harmonic frequency) which is an integral multiple, about twice, triple, . . . , of the fundamental mode is excited. A SAW that is excited so as to have a frequency which is about twice, triple, . . . , the fundamental mode as just described will be referred to as an overtone in the following description.

Moreover, the smaller the substrate thickness, the lower the velocity of the zero-order mode (A$_0$ mode) of an asymmetric Lamb wave of plate waves, which will be described later; on the contrary, the smaller the substrate thickness, the higher the velocity of the A$_1$ mode, that is, the first-order mode which is a higher-order mode of the asymmetric Lamb wave, and the ratio therebetween varies greatly depending on the thickness of the piezoelectric substrate. In addition, there is no integral multiple relationship between them. Like the Sezawa wave described above, the A$_1$ mode is a higher-order mode than the A$_0$ mode and is not an overtone.

Although the limit on the high-frequency side is about 3.2 GHz in the SAW device as described earlier, there have been reports of high-frequency devices operating at 3.2 GHz or higher and using plate waves, not a SAW. The plate waves include A$_0$ mode, A$_1$ mode, and S$_0$ mode Lamb waves having a longitudinal wave component and displacement of a shear vertical (SV) component and an SH$_0$ mode SH plate wave having a shear horizontal (SH) component. These plate waves propagate with vibration inside the entire substrate and greatly differ from a SAW that propagates exclusively along the surface of a substrate; therefore, the plate waves and the SAW are distinguished and used as such.

When the thickness of the piezoelectric substrate is less than or equal to 0.15 times the wavelength, a high velocity of 6,000 m/s which is about 1.5 times the velocity of the SAW is obtained in the S$_0$ mode and a high velocity of 12,000 to 25,000 m/s which is about 3 to 6 times the velocity of the SAW is obtained in the A$_1$ mode, which is advantageous to implementation of a higher-frequency device. For this reason, a 4.5-to-6.3 GHz resonator device is implemented by using the A$_1$ mode fundamental wave in a 0.34 to 0.48 µm LN or LT thin film (see, for example, Non-Patent Literature 5 or 6). However, since this device requires a cavity above and below an IDT portion on a piezoelectric thin plate that excites a plate wave, a major problem is that a thin plate having a thickness of 0.48 µm or less has low mechanical strength.

Therefore, to solve this problem of low mechanical strength of the plate wave, a device having a structure that does not require a cavity below a piezoelectric thin plate by using an acoustic multilayer film in such a way that it is in contact with the piezoelectric thin plate and exciting the fundamental mode of A$_1$ mode, S$_0$ mode, and SH$_0$ mode plate waves (see, for example, Non-Patent Literature 7 or Patent Literature 1) and a device using the fundamental mode of an SH$_0$ mode plate wave (see, for example, Patent Literature 2) are proposed. Moreover, a device using LN or LT and using the fundamental mode of a LLSAW is also proposed (see, for example, Patent Literature 3).

CITATION LIST

Non-Patent Literature

Non-Patent Literature 1: John D. Larson III et al., "Power Handling and Temperature Coefficient Studies in FBAR Duplexers for the 1900 MHz PCS Band", Proc. IEEE Ultrason. Symp., 2000, p. 869-874

Non-Patent Literature 2: Keiichi Umeda et al., "PIEZOELECTRIC PROPERTIES OF ScAlN THIN FILMS FOR PIRZO-MEMS DEVICES", Proc. MEMS (Taipei, Taiwan), 2013, p. 20-24

Non-Patent Literature 3: M. Kadota, Y. Ishii, T. Shimatsu, M. Umoto, and Shuji Tanaka, "Suprious-Free, Near- Zero-TCF Hetero Acoustic Layer (HAL) SAW Resonators Using LiTaO$_3$ Thin Plate on Quartz", Proc. IEEE Ultrason. Symp., 2018, 6J-2

Non-Patent Literature 4: T. Kimura, Y. Kishimoto, M. Omura and K. Hashimoto, "3.5 GHz longitudinal leaky surface acoustic wave resonator using a multilayered waveguide structure for high acoustic energy confinement", Jpn. J. Appl. Phys., 2018, vol. 57, 07LD15

Non-Patent Literature 5: M. Kadota, T. Ogami, K. Yamamoto, H. Tochishita, and Y. Negoro, "High frequency Lamb Wave Device composed of MEMS Structure using LiNbO$_3$ Thin Film and Air Gap", IEEE trans. Ultrason. Ferroelec. Freq. Cont., 2010, vol. 57, No. 11, p. 2564-2571

Non-Patent Literature 6: N. Assila, M. Kadota, and S. Tanaka, "High Frequency Resonator Using A$_1$ Mode Lamb Wave in LiTaO$_3$ Plate", IEEE trans. Ultrason. Ferroelec. Freq. Cont., 2019, vol. 66, No. 9, p. 1529-1535

Non-Patent Literature 7: T. Kimura, K. Daimon, T. Ogami and M. Kadota, "S$_0$ Mode Lamb Wave Resonators Using Thin Plate LiNbO$_3$ and Acoustic Quarter-Wave Multilayers", Jpn. J. Appl. Phys., 2013, vol. 52, 07HD03

Non-Patent Literature 8: Yasutaka Shimizu, "SAW propagation characteristics on LiTaO$_3$ with arbitrary cut", The Journal of the Acoustical Society of Japan, 1980, vol. 36, p. 140-145

Patent Literature

Patent Literature 1: Japanese Patent No. 5648695
Patent Literature 2: WO 2016/047255
Patent Literature 3: JP-A-2018-182615

SUMMARY OF THE INVENTION

The problem with the FBAR devices described in Non-Patent Literatures 1 and 2 is that they cannot achieve a good characteristic with a high impedance ratio in a superhigh frequency band of 6 GHz or higher. Moreover, as described in Non-Patent Literature 3 or 4, the problem with the conventional device using a surface acoustic wave (SAW) or a longitudinal leaky surface acoustic wave (LLSAW) is that it excites only the fundamental mode in a structure in which an interdigital transducer (IDT) is formed on a piezoelectric thin film and, even in a structure in which a piezoelectric thin film and a support substrate or an acoustic multilayer film and a support substrate are combined, an overtone of a frequency which is an integral multiple of the fundamental mode is not excited and the limit of the frequency on the high-frequency side is 3.5 GHz as a resonance frequency.

The problem with the device described in Patent Literature 1 is that an A$_1$ mode plate wave has a velocity of 15,500 m/s, which is determined by the antiresonance frequency of the fundamental mode, and this velocity is the velocity of the fundamental mode of the A$_1$ mode plate wave, not the velocity of an overtone. Moreover, the problem with the devices described in Non-Patent Literatures 5, 6, and 7 is that, although the velocity of the S$_0$ mode of LiNbO$_3$ (LN) or LiTaO$_3$ (LT) is 6,000 to 7,000 m/s irrespective of the azimuth angle and substrate thickness, this is also not the velocity obtained by using an overtone. In the SH$_0$ mode plate wave devices described in Patent Literatures 1 and 2, the velocities are not described; in the devices described in Non-Patent Literatures 5, 6, and 7, the velocity of the LN or LT SH$_0$ mode plate wave is about 4,000 m/s irrespective of the azimuth angle and substrate thickness.

The problem with the device described in Patent Literature 3 is that, although the device excites a LLSAW using the Al electrodes having thicknesses of 0.05, 0.06, and 0.08 wavelength, the device cannot excite an overtone greatly with these Al electrode thicknesses. It is to be noted that, in the device described in Patent Literature 3, the velocity of the fundamental mode of a LLSAW is about 6,000 m/s.

The present invention has been made in view of these problems and an object thereof is to provide an acoustic wave device that can achieve a good characteristic in a superhigh frequency band of 6 GHz or higher by using an overtone.

To attain the above object, an acoustic wave device according to the present invention includes: a piezoelectric substrate; an electrode provided in such a way as to be in contact with the piezoelectric substrate; and an acoustic multilayer film provided in such a way as to be in contact with the piezoelectric substrate and/or the electrode, wherein the acoustic wave device is configured to use an overtone of resonance characteristics of a surface acoustic wave.

The acoustic wave device according to the present invention can excite an overtone which is an approximately integral multiple (about twice, about triple, . . . ) of the frequency of the fundamental mode of a surface acoustic wave by the acoustic multilayer film. Moreover, by adjusting the thickness of the electrode, the type of the piezoelectric substrate, and the thickness of each layer of the acoustic multilayer film, it is possible to achieve an overtone of a surface acoustic wave having a high impedance ratio. By using this overtone, the acoustic wave device according to the present invention can achieve a good characteristic with a high impedance ratio in a superhigh frequency band of 6 GHz or higher. The surface acoustic wave that is the overtone has, for example, a velocity which corresponds to 9000 m/s or higher and sometimes corresponds to 10000 m/s or higher.

It is to be noted that, here, the impedance ratio (Impedance ratio) of the acoustic wave device is the ratio [20×log (Za/Zr)] between a resonance impedance Zr at a resonance frequency fr and an antiresonance impedance Za at an antiresonance frequency fa. Moreover, the bandwidth (Bandwidth) of the acoustic wave device is (fa−fr)/fr.

It is preferable that, in the acoustic wave device according to the present invention, the acoustic multilayer film is composed of an acoustic low impedance film and an acoustic high impedance film which are alternately stacked. In particular, it is preferable that the acoustic multilayer film includes an acoustic film composed of an acoustic low impedance film and an acoustic high impedance film which are alternately and continuously stacked in three layers or more and twenty layers or less. Moreover, in this case, the thickness of each of at least three layers of the acoustic low impedance films and the acoustic high impedance films of the acoustic multilayer film is preferably 0.012 to 0.118 wavelength, 0.105 to 0.2 wavelength, or 0.216 to 0.275 wavelength of the surface acoustic wave, more preferably 0.015 to 0.117 wavelength, 0.105 to 0.19 wavelength, or 0.22 to 0.27 wavelength of the surface acoustic wave, further preferably 0.02 to 0.12 wavelength, 0.114 to 0.172 wavelength, or 0.225 to 0.26 wavelength of the surface acoustic wave, and still further preferably 0.03 to 0.082 wavelength of the surface acoustic wave. Furthermore, in combinations of the acoustic low impedance film and the acoustic high impedance film of the acoustic multilayer film, the thickness of one of the films is more preferably 0.012 to 0.118 wavelength, 0.02 to 0.12 wavelength, or 0.03 to 0.082 wavelength. This makes it possible to efficiently excite an overtone of the surface acoustic wave.

It is preferable that, in the acoustic wave device according to the present invention, each acoustic low impedance film and/or each acoustic high impedance film of the acoustic multilayer film is made of a film containing at least one of a Mg alloy, $SiO_2$, SiOF, Al, Y, Si, Ge, Ti, ZnO, $Si_xN_y$ (where x and y are positive real numbers), AlN, SiC, $Al_2O_3$, Ag, $ZrO_2$, Hf, Cu, $TiO_2$, Cr, Ni, Au, Ta, Mo, Pt, and W or an oxide film, a nitride film, a carbide film, or an iodide film containing at least one of these materials. In addition to those described above, the acoustic low impedance film only has to be made of a film whose acoustic impedance is lower than that of the acoustic high impedance film adjacent thereto. It is to be noted that, in the acoustic wave device according to the present invention, the longitudinal wave acoustic impedance Zl and the transverse wave acoustic impedance Zs of each acoustic low impedance film and each acoustic high impedance film are expressed as (density× c33)$^{1/2}$ and (density×c44)$^{1/2}$, respectively (c33 and c44 are elastic stiffness constants). Of the two acoustic films that are used, an acoustic film with lower Zl or Zs is the acoustic low impedance film and an acoustic film with higher Zl or Zs is the acoustic high impedance film.

It is preferable that, in the acoustic wave device according to the present invention, the piezoelectric substrate is made of a monocrystal of $LiNbO_3$ or $LiTaO_3$. In this case, an overtone of the surface acoustic wave is easily excited.

It is preferable that, in the acoustic wave device according to the present invention, in order to achieve a high impedance ratio, the electrode includes an interdigital transducer provided on one of surfaces of the piezoelectric substrate, the acoustic multilayer film is provided in such a way as to be in contact with the other of the surfaces of the piezoelectric substrate, and the piezoelectric substrate is made of a $LiNbO_3$ crystal and has Euler angles (−30 to 30°, 60 to 103°, −15 to 15°) or (90°±6°, 90°±6°, −20 to 48°) or Euler angles crystallographically equivalent to the Euler angles (−30 to 30°, 60 to 103°, −15 to 15°) or (90°±6°, 90°±6°, −20 to 48°). Moreover, in this case, the piezoelectric substrate more preferably has Euler angles (−30 to 30°, 72 to 97°, −15 to 15°) or (90°±6°, 90°±6°, −10 to 43°) or Euler angles crystallographically equivalent to the Euler angles (−30 to 30°, 72 to 97°, −15 to 15°) or (90°±6°, 90°±6°, −10 to 43°). Furthermore, in this case, the piezoelectric substrate further preferably has Euler angles (−30 to 30°, 78 to 92°, −6 to 6°) or (90°±6°, 90°±6°, −2 to 33°) or Euler angles crystallographically equivalent to the Euler angles (−30 to 30°, 78 to 92°, −6 to 6°) or (90°±6°, 90°±6°, −2 to 33°).

It is preferable that, in the acoustic wave device according to the present invention, in order to achieve a high impedance ratio, the electrode includes an interdigital transducer provided on one of surfaces of the piezoelectric substrate and a floating electrode provided in such a way as to cover the other of the surfaces of the piezoelectric substrate, the acoustic multilayer film is provided in such a way as to be in contact with a surface of the floating electrode on a side thereof opposite to the piezoelectric substrate, and the piezoelectric substrate is made of a $LiNbO_3$ crystal and has Euler angles (−30 to 30°, 64 to 98°, −15 to 15°) or (90°±6°, 90°±6°, −4 to 56°) or Euler angles crystallographically equivalent to the Euler angles (−30 to 30°, 64 to 98°, −15 to 15°) or (90°±6°, 90°±6°, −4 to 56°). Moreover, in this case, the piezoelectric substrate more preferably has Euler angles (−30 to 30°, 68 to 95°, −15 to 15°) or (90°±6°, 90°±6°, −2 to 52°) or Euler angles crystallographically equivalent to the Euler angles (−30 to 30°, 68 to 95°, −15 to 15°) or (90°±6°, 90°±6°, −2 to 52°). Furthermore, in this case, the piezoelectric substrate further preferably has Euler angles (−30 to 30°, 72 to 92°, −15 to 15°) or (90°±6°, 90°±6°, 25 to 50°) or Euler angles crystallographically equivalent to the Euler angles (−30 to 30°, 72 to 92°, −15 to 15°) or (90°±6°, 90°±6°, 25 to 50°). It is to be noted that the floating electrode may be connected to one of the electrodes of the interdigital transducer or another common electrode other than the acoustic wave device according to the present invention.

When this piezoelectric substrate is made of a $LiNbO_3$ crystal, the thickness of the piezoelectric substrate is preferably 0.002 to 5 wavelength, more preferably 1.2 wavelength or less, and further preferably 0.02 to 0.3 wavelength of the surface acoustic wave. In this case, it is possible to achieve a higher impedance ratio.

It is preferable that, in the acoustic wave device according to the present invention, in order to achieve a high impedance ratio, the electrode includes an interdigital transducer provided on one of surfaces of the piezoelectric substrate, the acoustic multilayer film is provided in such a way as to be in contact with the other of the surfaces of the piezoelectric substrate, and the piezoelectric substrate is made of a $LiTaO_3$ crystal and has Euler angles (−30 to 30°, 55 to 100°, −15 to 15°), (90°±6°, 90°±6°, −5 to 61°), or (90°±6°, 90°±6°, 83 to 93°) or Euler angles crystallographically equivalent to the Euler angles (−30 to 30°, 55 to 100°, −15 to 15°), (90°±6°, 90°±6°, −5 to 61°), or (90°±6°, 90°±6°, 83 to 93°). Moreover, in this case, the piezoelectric substrate more preferably has Euler angles (−30 to 30°, 61 to 95°, −15 to 15°), (90°±6°, 90°±6°, 15 to 55°), or (90°±6°, 90°±6°, 85 to 91°) or Euler angles crystallographically equivalent to the Euler angles (−30 to 30°, 61 to 95°, −15 to 15°), (90°±6°, 90°±6°, 15 to 55°), or (90°±6°, 90°±6°, 85 to 91°). Furthermore, in this case, the piezoelectric substrate more preferably has Euler angles (−30 to 30°, 70 to 89°, −15 to 15°) or (90°±6°, 90°±6°, 23 to 38°) or Euler angles crystallographically equivalent to the Euler angles (−30 to 30°, 70 to 89°, −15 to 15°) or (90°±6°, 90°±6°, 23 to 38°).

It is preferable that, in the acoustic wave device according to the present invention, in order to achieve a high impedance ratio, the electrode includes an interdigital transducer provided on one of surfaces of the piezoelectric substrate and a floating electrode provided in such a way as to cover the other of the surfaces of the piezoelectric substrate, the acoustic multilayer film is provided in such a way as to be in contact with a surface of the floating electrode on a side thereof opposite to the piezoelectric substrate, and the piezoelectric substrate is made of a $LiTaO_3$ crystal and has Euler angles (−30 to 30°, 65 to 94°, −15 to 15°) or (90°±6°, 90°±6°, −4 to 56°) or Euler angles crystallographically equivalent to the Euler angles (−30 to 30°, 65 to 94°, −15 to 15°) or (90°±6°, 90°±6°, −4 to 56°). Moreover, in this case, the piezoelectric substrate more preferably has Euler angles (−30 to 30°, 69 to 91°, −15 to 15°) or (90°±6°, 90°±6°, −2 to 52°) or Euler angles crystallographically equivalent to the Euler angles (−30 to 30°, 69 to 91°, −15 to 15°) or (90°±6°, 90°±6°, −2 to 52°). Furthermore, in this case, the piezoelectric substrate further preferably has Euler angles (90°±6°, 90°±6°, 25 to 50°) or Euler angles crystallographically equivalent to the Euler angles (90°±6°, 90°±6°, 25 to 50°). It is to be noted that the floating electrode may be connected to one of the electrodes of the interdigital transducer or another common electrode other than the acoustic wave device according to the present invention.

When the piezoelectric substrate is made of a $LiTaO_3$ crystal, the thickness of the piezoelectric substrate is preferably 0.002 to 2.4 wavelength, more preferably 1 wavelength or less, and further preferably 0.02 to 0.25 wavelength of the surface acoustic wave. In this case, it is possible to achieve a higher impedance ratio.

It is preferable that, in the acoustic wave device according to the present invention, when MR represents a metalization ratio and λ represents a wavelength of the surface acoustic wave, a thickness of the interdigital transducer is (0.01 to 0.045λ)×0.5/MR or (0.1 to 0.21λ)×0.5/MR when a density thereof is 1800 kg/m³ or more and less than 6000 kg/m³, a thickness of the interdigital transducer is (0.01 to 0.033λ)× 0.5/MR or (0.06 to 0.2λ)×0.5/MR when a density thereof is 6000 kg/m³ or more and less than 10000 kg/m³, a thickness of the interdigital transducer is (0.008 to 0.03λ)×0.5/MR or (0.055 to 0.19λ)×0.5/MR when a density thereof is 10000 kg/m³ or more and less than 15000 kg/m³, or a thickness of the interdigital transducer is (0.005 to 0.02λ)×0.5/MR or (0.062 to 0.165λ)×0.5/MR when a density thereof is 15000 kg/m³ or more and less than 25000 kg/m³. In this case, it is possible to achieve a higher impedance ratio. It is to be noted that the metalization ratio (MR) of an interdigital transducer (IDT) is the ratio obtained by dividing the width F of an electrode finger of the interdigital transducer by a half of the period (λ) of the electrode fingers along the propagation direction of a surface acoustic wave and MR=F/(F+G)=2× F/λ. The half of the period (λ) of the electrode fingers is equal to the sum of the width F of the electrode finger and the gap G between the electrode fingers. Moreover, the period (wavelength) λ of the electrode fingers of the interdigital transducer is equal to the wavelength of a surface acoustic wave that is used.

Here, the Euler angles (φ, θ, ψ) are right-handed and represent a cut surface of a piezoelectric substrate and the propagation direction of an acoustic wave. That is, with respect to the crystallographic axes X, Y, and Z of a crystal or LT or LN, of which the piezoelectric substrate is made, the X-axis is rotated φ counterclockwise about the Z-axis which is used as a rotation axis, whereby an X'-axis is obtained. Next, the Z-axis is rotated θ counterclockwise about the X'-axis which is used as a rotation axis, whereby a Z'-axis is obtained. Here, the Z'-axis is assumed to be a normal and a plane including the X'-axis is assumed to be a cut surface of the piezoelectric substrate. Moreover, a direction in which the X'-axis is rotated ψ counterclockwise about the Z'-axis, which is used as a rotation axis, is assumed to be the propagation direction of an acoustic wave. Furthermore, an axis that is obtained by the movement of the Y-axis as a result of these rotations and is perpendicular to the X'-axis and the Z'-axis is assumed to be a Y'-axis.

By defining the Euler angles as just described, according to Non-Patent Literature 8, the following relationship holds for LN and LT which belong to the trigonal system 3m point group.

(φ,Θ,ψ)=(60°+φ,−θ,ψ)=(60°−φ,−θ,180°−ψ)=(φ,180°+θ,180°−ψ)=(φ,θ,180°+ψ)

For example, 40° rotated Y-plate X-direction propagation is expressed as (0°, 130°, 0°) by Euler angles and 40° rotated Y-plate 90° X-direction propagation is expressed as (0°, 130°, 90°) by Euler angles. It is to be noted that, when the piezoelectric substrate is cut at desired Euler angles, there is a possibility that an error on the order of up to ±0.5° will occur for each component of the Euler angles. As for the characteristics of an acoustic wave, there is almost no difference in characteristics due to a deviation on the order of ±5° for φ and ψ of the Euler angles (φ, θ, ψ). Moreover, (0°, θ±360°, 0°) are planes equivalent to Euler angles (0°, θ, 0°) in terms of Euler angles. On the other hand, although (0°, θ+180°, 0°) are not planes equivalent to (0°, θ, 0°) in terms of Euler angles, they correspond to relationship between front and back sides of the substrate. However, since the front and back sides exhibit the same characteristics in the acoustic wave device, the azimuths corresponding to relationship between front and back sides of the substrate are regarded as equivalent planes here.

According to the present invention, it is possible to provide an acoustic wave device that can achieve a good characteristic in a superhigh frequency band of 6 GHz or higher by using an overtone.

DETAILED DESCRIPTION OF THE INVENTION

Hereinafter, an embodiment of the present invention will be described based on the drawings and examples.

FIGS. 1 to 27 show an acoustic wave device of the embodiment of the present invention.

Figure 1:
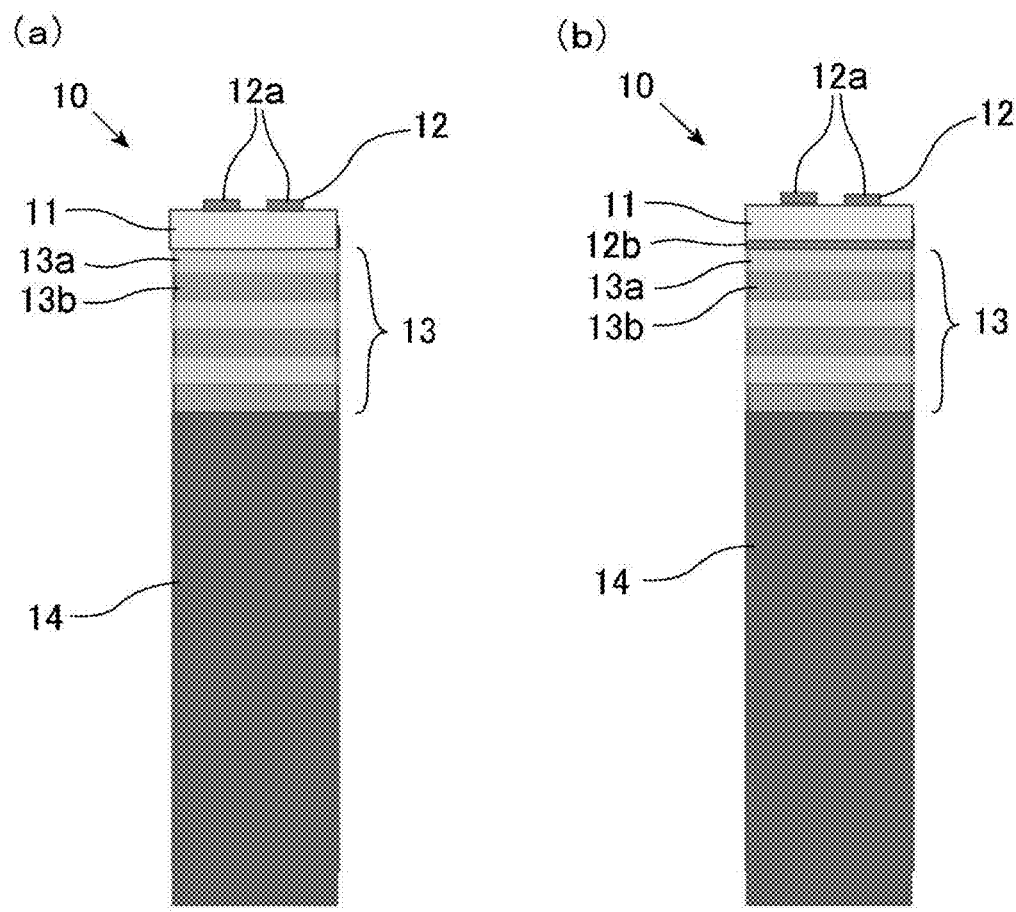
FIG. 1(a) is a side view of an acoustic wave device of an embodiment of the present invention and FIG. 1(b) is a side view showing a modification thereof with a floating electrode.
Figure 2:
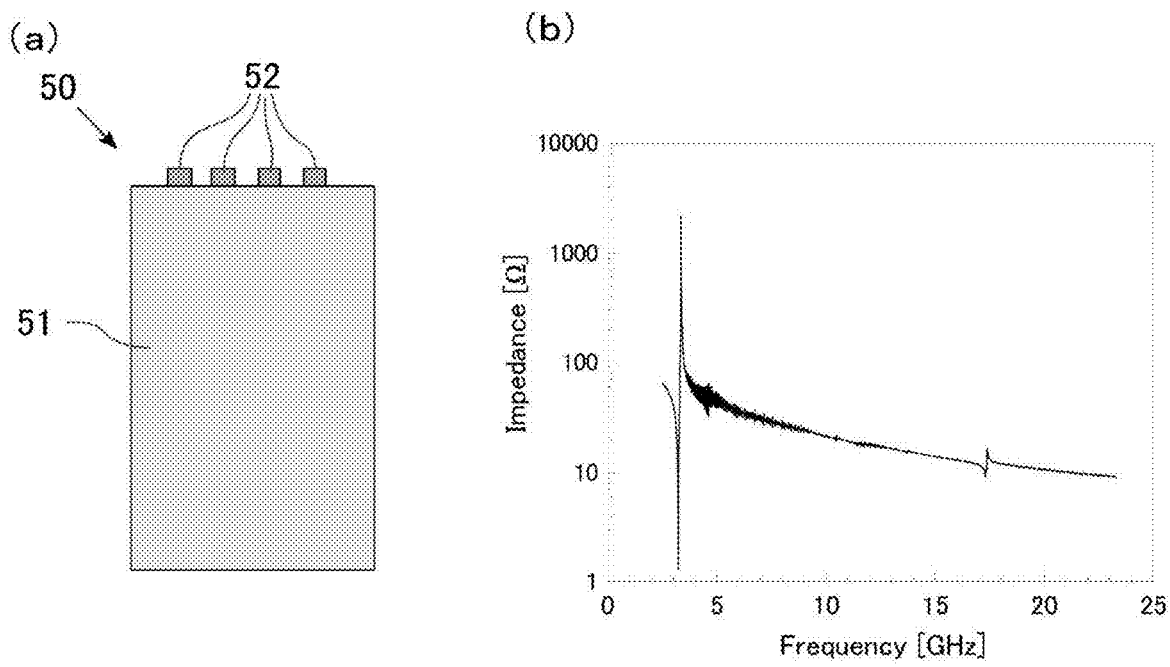
FIG. 2(a) is a side view of a conventional acoustic wave device and FIG. 2(b) is a graph showing the frequency response thereof.

As shown in FIG. 1, an acoustic wave device 10 is configured to use an overtone of the resonance characteristics of a surface acoustic wave and includes a piezoelectric substrate 11, an electrode 12, an acoustic multilayer film 13, and a support substrate 14.

As shown in FIG. 1(a), the piezoelectric substrate 11 is made of a monocrystal of LiNbO$_3$ (LN) or a monocrystal of LiTaO$_3$ (LT). The electrode 12 includes an interdigital transducer (IDT) 12a and is formed on one of the surfaces of the piezoelectric substrate 11 by a photolithography process or the like. The period (wavelength) λ of the electrode fingers of the interdigital transducer 12a is equal to the wavelength of a surface acoustic wave that is used, which is the fundamental mode and an overtone. In the following description, the wavelength (λ) represents the period (wavelength) of the electrode fingers, that is, the wavelength of a surface acoustic wave that is used, which is the fundamental mode and an overtone.

The acoustic multilayer film 13 is stuck on a surface of the piezoelectric substrate 11 on the side thereof opposite to the IDT. The acoustic multilayer film 13 is composed of an acoustic low impedance film 13a and an acoustic high impedance film 13b which are alternately stacked from the side where the piezoelectric substrate 11 is located to the side opposite thereto. Moreover, it is preferable that the acoustic multilayer film 13 includes an acoustic film composed of the acoustic low impedance film 13a and the acoustic high impedance film 13b which are alternately and continuously stacked in three layers or more and twenty layers or less. In one specific example shown in FIG. 1(a), a layer closest to the piezoelectric substrate 11 is the acoustic low impedance film 13a and the acoustic low impedance films 13a and the acoustic high impedance films 13b are alternately and continuously stacked in six layers.

Each of the acoustic low impedance film 13a and the acoustic high impedance film 13b is made of a film containing at least one of materials shown in Table 1 or 2. It is to be noted that Zl in Table 1 represents the acoustic impedance of a longitudinal wave of a surface acoustic wave, c33 represents an elastic stiffness constant, Zs in Table 2 represents the acoustic impedance of a transverse wave of a surface acoustic wave, and c44 represents an elastic stiffness constant. Moreover, x and y in $Si_xN_y$ in Tables 1 and 2 are positive real numbers. Furthermore, which of the acoustic impedance Zl of Table 1 and the acoustic impedance Zs of Table 2 contributes depends on the displacement of a SAW. That is, a SAW containing many longitudinal wave components depends on Zl and a SAW containing many SH components depends on Zs.

TABLE 1

| | | Zl | | |
|---|---|---|---|---|
| Material | Density (kg · m3) | C33 | V1 (m/s) | Z1 (Ns/m3) |
| Mg alloy | 1800 | 7.222E+10 | 6334 | 1.140E+07 |
| SiO2 | 2210 | 7.850E+10 | 5960 | 1.317E+07 |
| Al | 2699 | 1.113E+11 | 6422 | 1.733E+07 |
| Y | 4472 | 7.523E+10 | 4102 | 1.834E+07 |
| Si | 2329 | 2.365E+11 | 10077 | 2.347E+07 |
| Ge | 5323 | 1.26E+11 | 4866 | 2.590E+07 |
| Ti | 4510 | 1.661E+11 | 6069 | 2.737E+07 |
| ZnO | 5665 | 2.096E+11 | 6083 | 3.446E+07 |
| $Si_xN_y$ | 3200 | 3.710E+11 | 10767 | 3.446E+07 |
| AlN | 3260 | 3.950E+11 | 11008 | 3.588E+07 |
| SiC | 3200 | 4.580E+11 | 11963 | 3.828E+07 |
| Al2O3 | 3800 | 4.170E+11 | 10476 | 3.981E+07 |
| Ag | 10500 | 1.527E+11 | 3814 | 4.004E+07 |
| ZrO2 | 6000 | 2.772E+11 | 6797 | 4.078E+07 |
| Hf | 13310 | 1.380E+11 | 3219 | 4.285E+07 |
| Cu | 8930 | 2.106E+11 | 4856 | 4.337E+07 |
| TiO2 | 4249 | 4.700E+11 | 10517 | 4.469E+07 |
| Cr | 7190 | 3.141E+11 | 6610 | 4.752E+07 |
| Ni | 8845 | 3.115E+11 | 5934 | 5.249E+07 |
| Au | 19300 | 2.202E+11 | 3378 | 6.519E+07 |
| Ta | 16678 | 2.668E+11 | 4000 | 6.671E+07 |
| Mo | 10219 | 4.696E+11 | 6779 | 6.927E+07 |
| Pt | 21400 | 3.356E+11 | 3960 | 8.474E+07 |
| W | 19265 | 5.214E+11 | 5202 | 1.002E+08 |

TABLE 2

| | | Zs | | |
|---|---|---|---|---|
| Material | Density (kg · m3) | C44 | Vs (m/s) | Zs (Ns/m3) |
| Mg alloy | 1800 | 1.667E+10 | 3043 | 5.478E+06 |
| SiO2 | 2210 | 3.120E+10 | 3757 | 8.304E+06 |
| Al | 2699 | 2.610E+10 | 3110 | 8.393E+06 |
| Y | 4472 | 2.55E+10 | 2390 | 1.069E+07 |
| Si | 2329 | 7.227E+10 | 5570 | 1.297E+07 |
| Ti | 4510 | 4380E+10 | 3116 | 1.405E+07 |
| Ge | 5323 | 4.09E+10 | 2771 | 1.475E+07 |
| ZnO | 5665 | 4230E+10 | 2733 | 1.548E+07 |
| Ag | 10500 | 3.290E+10 | 1770 | 1.859E+07 |

TABLE 2-continued

Zs

| Material | Density (kg · m3) | C44 | Vs (m/s) | Zs (Ns/m3) |
|---|---|---|---|---|
| $Si_xN_y$ | 3200 | 1.130E+11 | 5942 | 1.902E+07 |
| Hf | 13310 | 2.847E+10 | 1462 | 1.947E+07 |
| AlN | 3260 | 1.180E+11 | 6016 | 1.961E+07 |
| ZrO2 | 6000 | 7.63E+10 | 3567 | 2.140E+07 |
| Cu | 8930 | 5.140E+10 | 2399 | 2.142E+07 |
| TiO2 | 4249 | 1.232E+11 | 5385 | 2.288E+07 |
| SiC | 3200 | 1.650E+11 | 7181 | 2.298E+07 |
| Al2O3 | 3800 | 1.460E+11 | 6198 | 2.355E+07 |
| Au | 19300 | 2.990E+10 | 1245 | 2.402E+07 |
| Ni | 8845 | 9.290E+10 | 3241 | 2.867E+07 |
| Cr | 7190 | 1.15E+11 | 4005 | 2.879E+07 |
| Mo | 10219 | 1.068E+11 | 3233 | 3.304E+07 |
| Pt | 21400 | 5.968E+10 | 1670 | 3.574E+07 |
| Ta | 16678 | 8.249E+10 | 2224 | 3.709E+07 |
| W | 19265 | 1.604E+11 | 2885 | 5.559E+07 |

Each acoustic low impedance film 13a is made of a film whose acoustic impedance is lower than that of the acoustic high impedance film 13b adjacent thereto. The acoustic low impedance films 13a may be made of the same film or may be made of different films. Moreover, the acoustic high impedance films 13b may be made of the same film or may be made of different films.

The support substrate 14 is stuck on a surface of the acoustic multilayer film 13 on the side thereof opposite to the piezoelectric substrate 11 in such a way that the acoustic multilayer film 13 is sandwiched between the support substrate 14 and the piezoelectric substrate 11. The support substrate 14 is provided so as to support the piezoelectric substrate 11, the electrode 12, and the acoustic multilayer film 13. In the specific example shown in FIG. 1(a), the support substrate 14 is made of a Si substrate; in addition thereto, the support substrate 14 may be made of a glass substrate, a quartz substrate, an alumina substrate, a sapphire substrate, a germanium substrate or the like. In FIG. 1(a), the IDT is provided on the surface of the piezoelectric substrate on the side thereof opposite to the acoustic multilayer film; the IDT may be provided between the piezoelectric substrate and the acoustic multilayer film.

It is to be noted that, as shown in FIG. 1(b), the acoustic wave device 10 may include a floating electrode (which is sometimes called a short-circuit electrode) 12b provided between the piezoelectric substrate 11 and the acoustic multilayer film 13. The floating electrode 12b may be made of the same material as the interdigital transducer 12a or may be made of a material different from the material for the interdigital transducer 12a. Moreover, in FIG. 1(b), the IDT is provided on a surface of the piezoelectric substrate on the side thereof opposite to the acoustic multilayer film and the floating electrode is provided between the piezoelectric substrate and the acoustic multilayer film; the IDT may be provided between the piezoelectric substrate and the acoustic multilayer film and the floating electrode may be provided on a surface of the piezoelectric substrate on the side thereof opposite to the acoustic multilayer film. It is to be noted that the floating electrode 12b may be connected to one of the electrodes of the interdigital transducer 12a or another common electrode other than the acoustic wave device 10.

Next, an operation will be described.

The acoustic wave device 10 can excite an overtone which is an approximately integral multiple (about twice, about triple, . . . ) of the frequency of the fundamental mode of a surface acoustic wave by the acoustic multilayer film 13. Moreover, by adjusting the thickness of the electrode 12, the type of the piezoelectric substrate 11, and the thickness of each layer of the acoustic multilayer film 13, it is possible to achieve an overtone of a surface acoustic wave having a high impedance ratio. By using this overtone, the acoustic wave device 10 can achieve a good characteristic with a high impedance ratio in a superhigh frequency band of 6 GHz or higher.

[Conventional Acoustic Wave Device]

The frequency response of a SAW resonator 50 shown in FIG. 2(a), which has been put to practical use and has a 420 YX LT film 51 with a surface on which an Al electrode (wavelength 1.2 µm, thickness 0.08 wavelength) is provided as an interdigital transducer (IDT) 52, was obtained. The results are shown in FIG. 2(b). As shown in FIG. 2(b), the frequency of the fundamental mode (zero order) was 3.2 GHz, the bandwidth was 3.6%, and the impedance ratio was 65 dB. Although an overtone-like small response that is a little more than five times the fundamental mode is observed at 17.2 GHz, the results indicate that it has not reached a practicable level.

Example of the Present Invention

The frequency response of the acoustic wave device 10 shown in FIG. 1(a) was obtained, which was observed when the interdigital transducer 12a was a Cu electrode having a wavelength of 1.2 µm and a thickness of 0.1 wavelength, the piezoelectric substrate 11 was LT (thickness 0.2 wavelength) with Euler angles (90°, 90°, 35°), the acoustic multilayer film 13 was composed of the acoustic low impedance film 13a (thickness 0.25 wavelength) made of a $SiO_2$ film and the acoustic high impedance film 13b (thickness 0.25 wavelength) made of a Ta film which were alternately stacked in six layers in total, and the support substrate 14 was a Si substrate. The results are shown in FIG. 3(a). As shown in FIG. 3(a), the fundamental mode of a SAW was observed at 3.8 GHz and large responses of spurious and harmonics thereof were observed at 2 GHz, 5.1 GHz, 6.3 GHz, and 8.2 GHz. Moreover, a response of an overtone that was about three times the zero-order mode was observed at 11 GHz. It is to be noted that a response at 5.1 GHz is a LLSAW with a velocity of 6,100 m/s. Hereinafter, the Euler angles (φ, θ, ψ) will be simply written as (φ, θ, ψ).

Next, the frequency response of the acoustic wave device 10 shown in FIG. 1(b) was obtained, which was observed when the interdigital transducer 12a was a Cu electrode having a thickness of 0.1 wavelength, the piezoelectric substrate 11 was (90°, 90°, 42.5°) LN (thickness 0.2 wavelength), with an Al electrode, which was the floating electrode 12b (thickness 0.01 wavelength), sandwiched between the piezoelectric substrate 11 and the acoustic multilayer film 13, the acoustic multilayer film 13 was composed of the acoustic low impedance film 13a (thickness 0.05 wavelength) made of a $SiO_2$ film and the acoustic high impedance film 13b made of a Ta film which were alternately stacked in six layers in total, the support substrate 14 was a Si substrate, and the thickness of the Ta film, which was the acoustic high impedance film 13b, was varied from 0.05 wavelength to 0.23 wavelength. The results are shown in FIG. 3(b).

As shown in FIG. 3(b), it has been confirmed that, when the thickness of the Ta film is 0.05 wavelength, a response near the center frequency 3 GHz is the fundamental mode, a response near 10 GHz is an overtone ("O3" in the drawing) that is about three times the fundamental mode, a response at 12 GHz is an overtone ("O4" in the drawing) that is about four times the fundamental mode, and a response near 15 GHz is an overtone ("O5" in the drawing) that is about five times the fundamental mode. Moreover, it has also been confirmed that there is one response (hereinafter referred to as an A response) between the overtone that is about three times the fundamental mode and the overtone that is about four times the fundamental mode. It has been confirmed that, when the thickness of the Ta film is 0.115 wavelength, the frequency of the overtone that is about three times the fundamental mode decreases and a response becomes smaller. Furthermore, it has also been confirmed that the frequency of the overtone that is about four times the fundamental mode also decreases, but a response remains small. It has been confirmed that, when the thickness of the Ta film is 0.13 wavelength, the frequency of the overtone that is about four times the fundamental mode when the Ta film has a thickness of 0.05 wavelength further decreases and becomes an overtone that is about three times the fundamental mode (about 10 GHz), but has a high impedance ratio. As just described, it has been confirmed from FIG. 3(b) that, as the Ta film becomes thicker, the frequency of each response decreases and a phenomenon in which the impedance ratio increases or decreases is repeated. It is clear from the above results that there are two or more, not one, conditions of the thickness of the Ta film by which a high impedance ratio is achieved. Moreover, it has also been confirmed that the same phenomenon is observed when the thickness of the $SiO_2$ film, which is the acoustic low impedance film 13a, is varied with the thickness of the Ta film kept constant.

Next, the frequency responses of the acoustic wave devices 10 shown in FIGS. 1(a) and (b) were obtained, which were observed when the conditions were varied in various ways. First, the frequency response of the acoustic wave device 10 shown in FIG. 1(a), which was observed when the interdigital transducer 12a was a Cu electrode having a wavelength of 1.2 μm and a thickness of 0.1 wavelength, the piezoelectric substrate 11 was (0°, 85°, 0°) LN (thickness 0.2 wavelength), the acoustic multilayer film 13 was composed of the acoustic low impedance film 13a (thickness 0.06 wavelength) made of an Al film and the acoustic high impedance film 13b (thickness 0.06 wavelength) made of a W film which were alternately stacked in six layers in total, and the support substrate 14 was a Si substrate, is shown in FIG. 4(a). Moreover, the frequency response of the acoustic wave device 10 shown in FIG. 1(b), which was observed when the interdigital transducer 12a was a Cu electrode 12 having a wavelength of 1.2 μm and a thickness of 0.1 wavelength, the piezoelectric substrate 11 was (90°, 90°, 42.5°) LN (thickness 0.2 wavelength), the floating electrode 12b was an Al electrode, the acoustic multilayer film 13 was composed of the acoustic low impedance film 13a (thickness 0.05 wavelength) made of a $SiO_2$ film and the acoustic high impedance film 13b (thickness 0.05 wavelength) made of a Ta film which were alternately stacked in six layers in total, and the support substrate 14 was a Si substrate, is shown in FIG. 4(b).

Furthermore, the frequency response of the acoustic wave device 10 shown in FIG. 1(a), which was observed when the interdigital transducer 12a was a Cu electrode having a wavelength of 1.2 μm and a thickness of 0.1 wavelength, the piezoelectric substrate 11 was (0°, 85°, 0°) LT (thickness 0.15 wavelength), the acoustic multilayer film 13 was composed of the acoustic low impedance film 13a (thickness 0.05 wavelength) made of an Al film and the acoustic high impedance film 13b (thickness 0.05 wavelength) made of a W film which were alternately stacked in six layers in total, and the support substrate 14 was a Si substrate, is shown in FIG. 4(c). Moreover, the frequency response of the acoustic wave device 10 shown in FIG. 1(b), which was observed when the interdigital transducer 12a was a Cu electrode having a wavelength of 1.2 μm and a thickness of 0.1 wavelength, the piezoelectric substrate 11 was (90°, 90°, 35°) LT (thickness 0.15 wavelength), the floating electrode 12b was an Al electrode, the acoustic multilayer film 13 was composed of the acoustic low impedance film 13a (thickness 0.07 wavelength) made of a $SiO_2$ film and the acoustic high impedance film 13b (thickness 0.07 wavelength) made of a Ta film which were alternately stacked in six layers in total, and the support substrate 14 was a Si substrate, is shown in FIG. 4(d). It is to be noted that, in a case shown in FIG. 1(a) where the floating electrode 12b is not provided, the surface of the Al film in contact with the piezoelectric substrate 11 is preferably an alumite film that is an insulating film.

Figure 3:
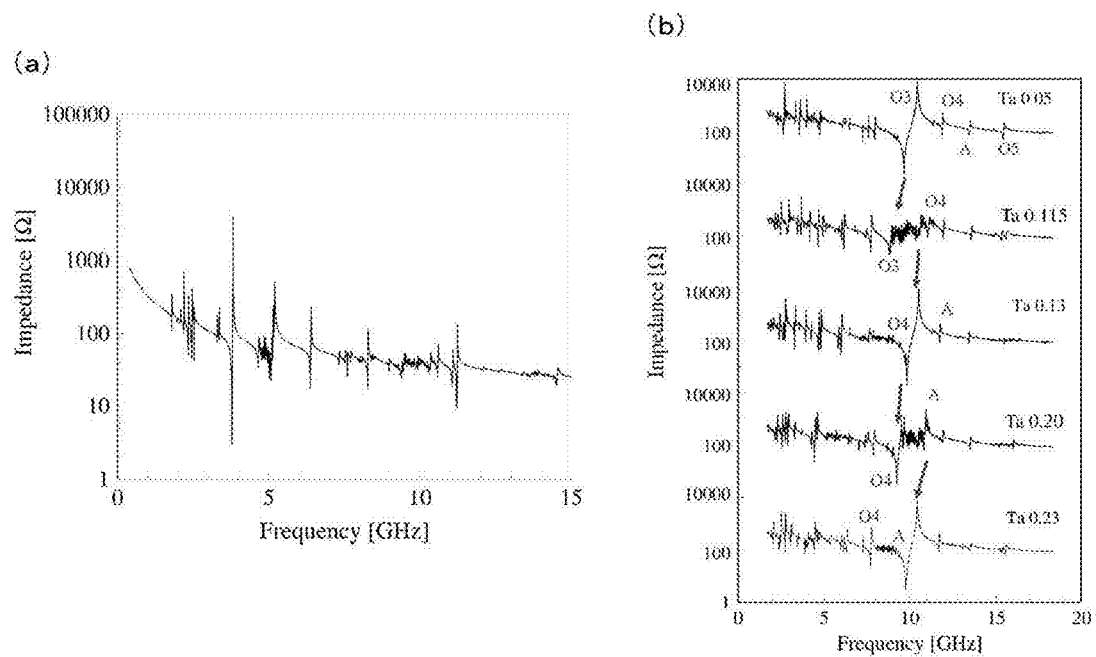
FIG. 3(a) is a graph showing the frequency response of the acoustic wave device shown in FIG. 1(a) in a structure with Cu (0.1λ in thickness)/(90°, 90°, 35°) LT (0.2λ in thickness)/SiO₂ (0.25λ in thickness)/Ta (0.25λ in thickness)/SiO₂ (0.25λ in thickness)/Ta (0.25λ in thickness)/SiO₂ (0.25λ in thickness)/Ta (0.25λ in thickness)/a Si substrate (hereinafter "in thickness" is omitted)
FIG. 3(b) is a graph showing the frequency response of the acoustic wave device shown in FIG. 1(b) observed when the thickness of a Ta film is varied in a structure with Cu (0.1λ)/(90°, 90°, 42.5°) LN (0.2λ)/a floating electrode/SiO₂ (0.05λ)/Ta/SiO₂ (0.05λ)/Ta/SiO₂ (0.05λ)/Ta/a Si substrate.
Figure 4:
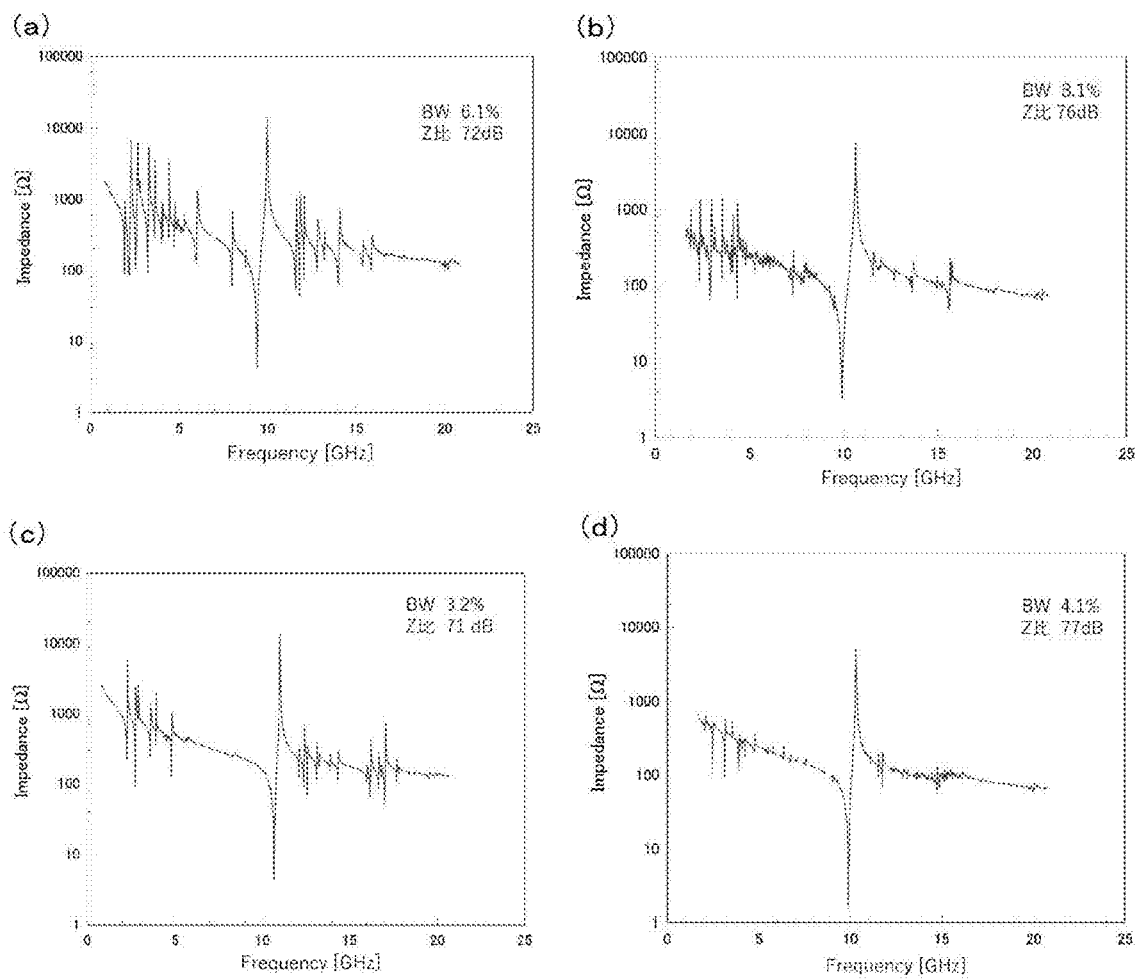
FIG. 4(a) is a graph showing the frequency response of the acoustic wave device shown in FIG. 1(a) in a structure with Cu (0.2λ)/(0°, 85°, 0°) LN (0.2λ)/Al (0.06λ)/W (0.06λ)/Al (0.06λ)/W (0.06λ)/Al (0.06λ)/W (0.06λ)/a Si substrate.
FIG. 4(b) is a graph showing the frequency response of the acoustic wave device shown in FIG. 1(b) in a structure with Cu (0.1λ)/(90°, 90°, 42.5°) LN (0.2λ)/a floating electrode/SiO₂ (0.05λ)/Ta (0.03λ)/SiO₂ (0.05λ)/Ta (0.03λ)/SiO₂ (0.05λ)/Ta (0.03λ)/a Si substrate.
FIG. 4(c) is a graph showing the frequency response of the acoustic wave device shown in FIG. 1(a) in a structure with Cu (0.12λ)/(0°, 85°, 0°) LT (0.15λ)/Al (0.05λ)/W (0.05λ)/Al (0.05λ)/W (0.05λ)/Al (0.05λ)/W (0.05λ)/a Si substrate.
FIG. 4(d) is a graph showing the frequency response of the acoustic wave device shown in FIG. 1(b) in a structure with Cu (0.1λ)/(90°, 90°, 35°) LT (0.15λ)/a floating electrode/SiO₂ (0.07λ)/Ta (0.07λ)/SiO₂ (0.07λ)/Ta (0.07λ)/SiO₂ (0.07λ)/Ta (0.07λ)/a Si substrate.

As shown in FIGS. 4(a) to (d), it has been confirmed that, in any of the frequency responses, the magnitudes of the fundamental mode and spurious of a SAW at 1 to 5 GHz are very small compared to that of the fundamental mode of FIG. 3. On the other hand, it has been confirmed that a response of an overtone at 9 to 11 GHz is large and a bandwidth of 3.2 to 8.1% and an impedance ratio of 71 to 76 dB are achieved. The frequency of this overtone corresponds to a velocity of 12,000 to 13,000 m/s and is a frequency that is 3.1 times the fundamental mode shown in FIG. 2.

The results obtained when the conditions were varied in various ways to achieve an overtone with a good characteristic will be shown below.

[When a LN Substrate was Used]

The dependence of the bandwidth (Bandwidth) on the Euler angle θ and the dependence of the impedance ratio (Impedance ratio) on the Euler angle θ, which were observed when the acoustic wave device 10 shown in FIG. 1(a) had a structure in which the interdigital transducer 12a was a Cu electrode having a wavelength of 1.2 μm and a thickness of 0.1 wavelength, the piezoelectric substrate 11 was (0°, θ, 0°) LN (thickness 0.2 wavelength), the acoustic multilayer film 13 was composed of the acoustic low impedance film 13a (thickness 0.05 wavelength) made of an Al film and the acoustic high impedance film 13b (thickness 0.05 wavelength) made of a W film which were alternately stacked in six layers in total, and the support substrate 14 was a Si substrate (hereinafter written as Cu (0.1λ)/(0°, θ, 0°) LN (0.2λ)/Al (0.05λ)/W (0.05λ)/Al (0.05λ)/W (0.05λ)/Al (0.05λ)/W (0.05λ)/a Si substrate), are shown in FIGS. 5(a) and (b), respectively. It is desirable that the surface of the Al film, which is the first layer of the acoustic multilayer film 13, on the side where the piezoelectric substrate is located is subjected to alumite treatment to make it insulated or an insulating acoustic low impedance film such as a $SiO_2$ film is used thereon. Unless otherwise specified, it is assumed that, when the floating electrode 12b in contact with the Al film, which is the first layer of the acoustic multilayer film 13, is not provided, the surface of the Al film, which is the first layer, in the following examples is subjected to alumite treatment. As shown in FIGS. 5(a) and (b), it has been confirmed that a bandwidth of 3% or more and an impedance ratio of 60 dB or higher are achieved when θ=60 to 103°. Moreover, it has been confirmed that an impedance ratio is 65 dB or higher when θ=72 to 970 and 70 dB or higher when θ=78 to 92°.

Figure 6:
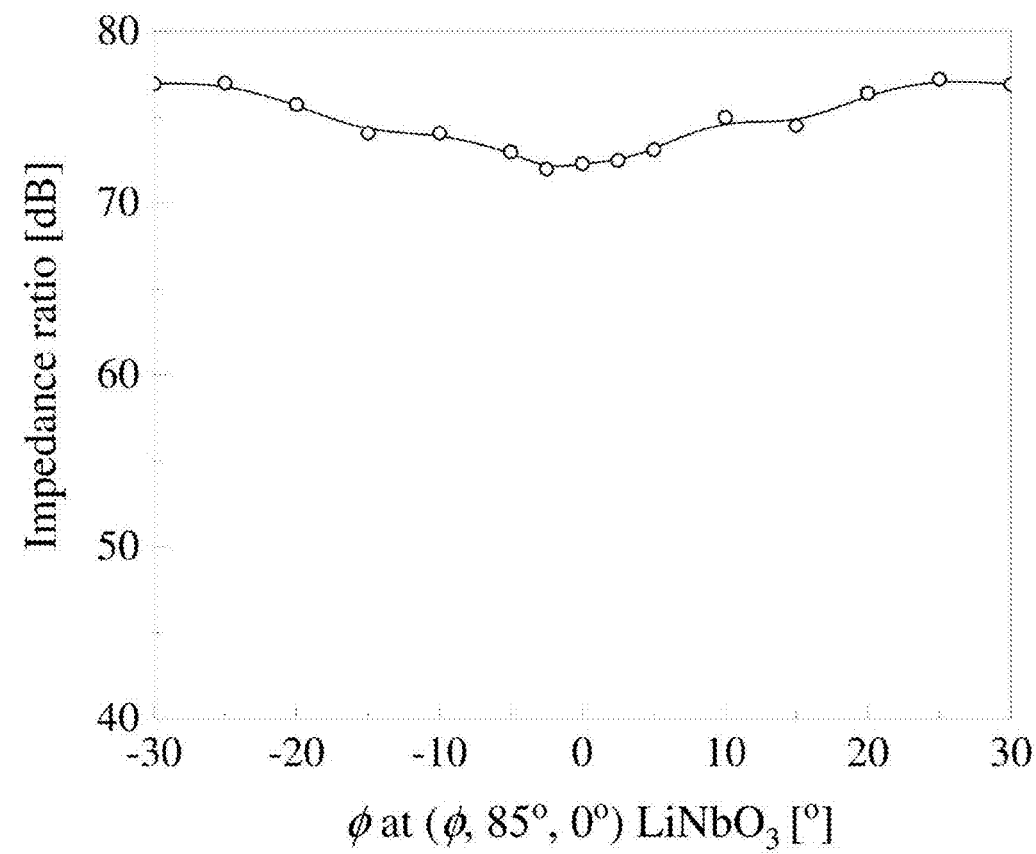
FIG. 6 is a graph showing the relationship between the impedance ratio and the Euler angle φ in a structure of the acoustic wave device shown in FIG. 1(a) with Cu (0.1λ)/(φ, 85°, 0°) LN (0.2λ)/Al (0.05λ)/W (0.05λ)/Al (0.05λ)/W (0.05λ)/Al (0.05λ)/W (0.05λ)/a Si substrate.

The dependence of the impedance ratio on the Euler angle φ observed when the acoustic wave device 10 shown in FIG. 1(a) had Cu (0.1λ)/(φ, 85°, 0°) LN (0.2λ)/Al (0.05λ)/W (0.05λ)/Al (0.05λ)/W (0.05λ)/Al (0.05λ)/W (0.05λ)/a Si substrate is shown in FIG. 6. As shown in FIG. 6, it has been confirmed that an impedance ratio of 70 dB or higher is achieved when ϕ=−30 to 30°.

Figure 7:
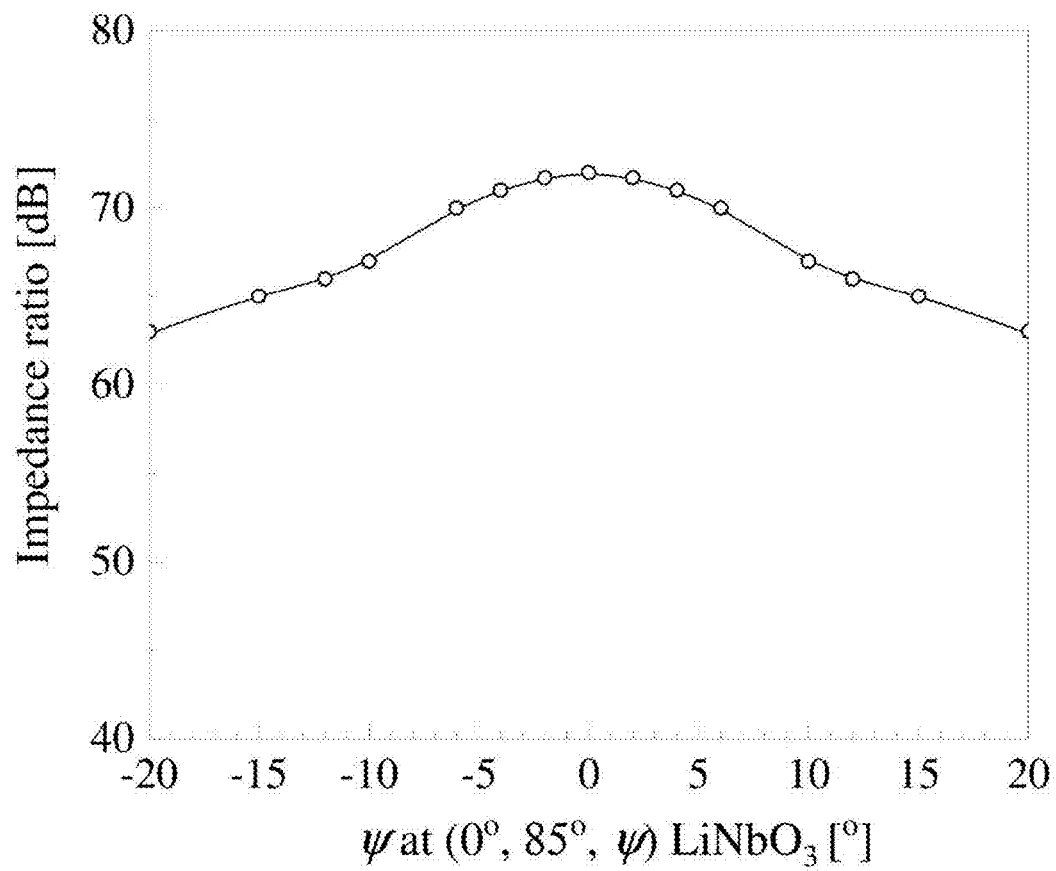
FIG. 7 is a graph showing the relationship between the impedance ratio and the Euler angle ψ in a structure of the acoustic wave device shown in FIG. 1(a) with Cu (0.1λ)/(0°, 85°, ψ) LN (0.2λ)/Al (0.05λ)/W (0.05λ)/Al (0.05λ)/W (0.05λ)/Al (0.05λ)/W (0.05λ)/a Si substrate.
Figure 8:
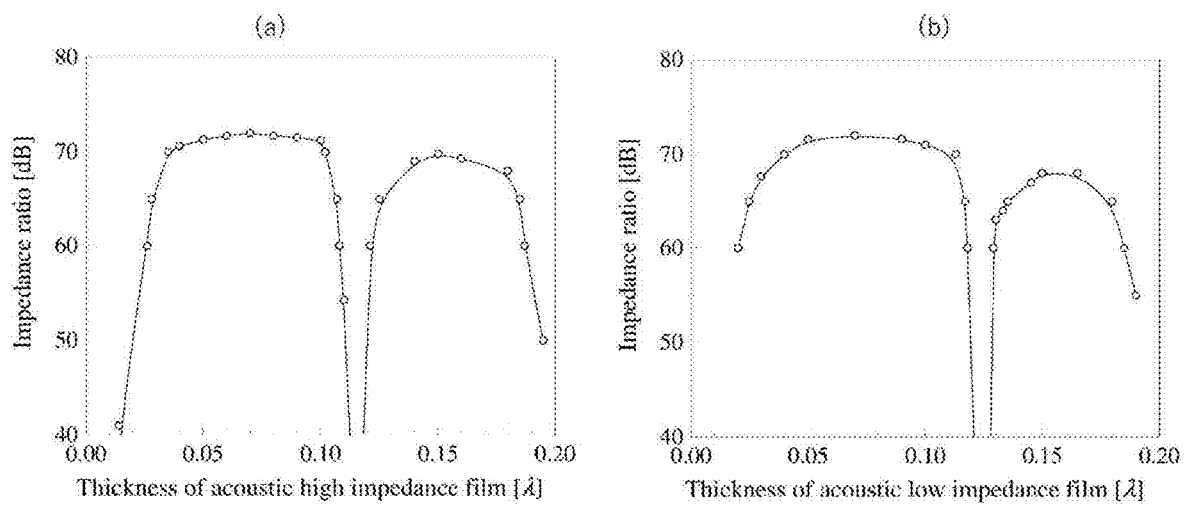
FIG. 8(a) is a graph showing the relationship between the impedance ratio and the W film thickness of an acoustic high impedance film and FIG. 8(b) is a graph showing the relationship between the impedance ratio and the Al film thickness of an acoustic low impedance film in a structure of the acoustic wave device shown in FIG. 1(a) with Cu (0.1λ)/(0°, 85°, 0°) LN (0.2λ)/Al/W/Al/W/Al/W/a Si substrate.
Figure 9:
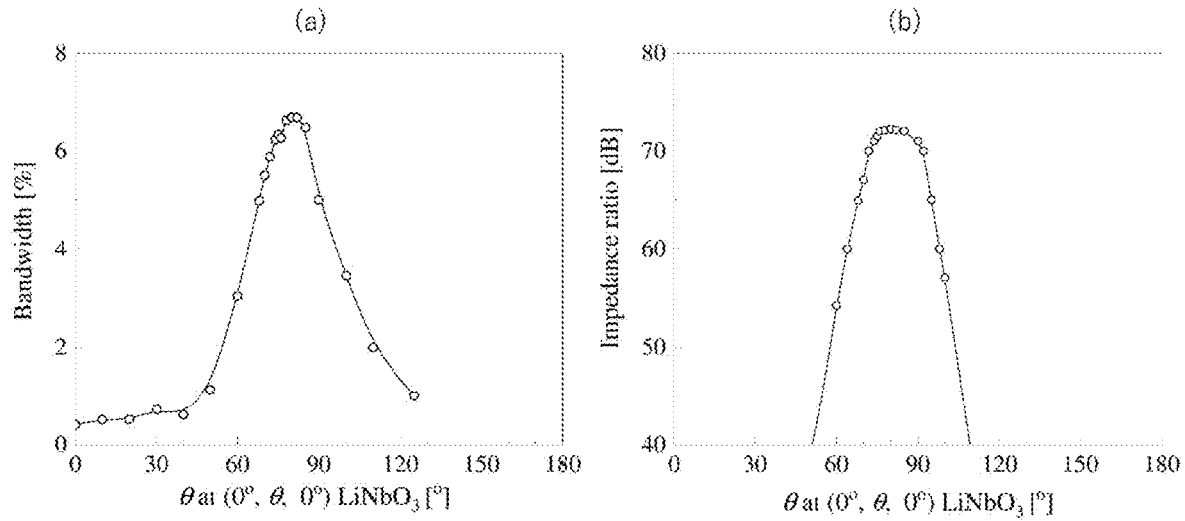
FIG. 9(a) is a graph showing the relationship between the bandwidth and the Euler angle θ and FIG. 9(b) is a graph showing the relationship between the impedance ratio and the Euler angle θ in a structure of the acoustic wave device shown in FIG. 1(b) with Cu (0.1λ)/(0°, θ, 0°) LN (0.2λ)/a floating electrode/Al (0.05λ)/W (0.05λ)/Al (0.05λ)/W (0.05λ)/Al (0.05λ)/W (0.05λ)/a Si substrate.
Figure 10:
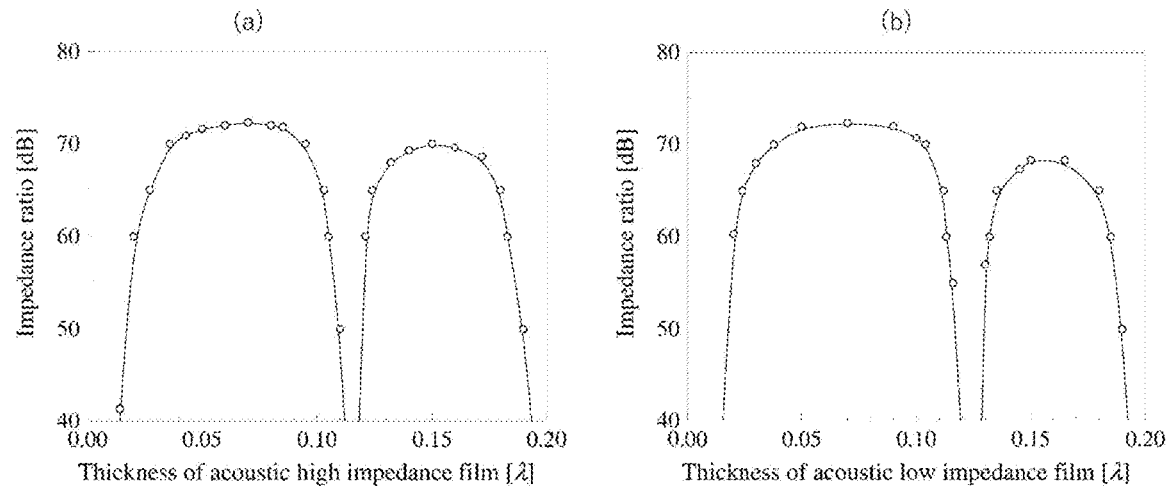
FIG. 10(a) is a graph showing the relationship between the impedance ratio and the W film thickness of an acoustic high impedance film when an Al film thickness is 0.05λ
FIG. 10(b) is a graph showing the relationship between the impedance ratio and the Al film thickness of an acoustic low impedance film when a W film thickness is 0.05λ in a structure of the acoustic wave device shown in FIG. 1(b) with Cu (0.1λ)/(0°, 85°, 0°) LN (0.2λ)/a floating electrode/Al/W/Al/W/Al/W/a Si substrate.
Figure 11:
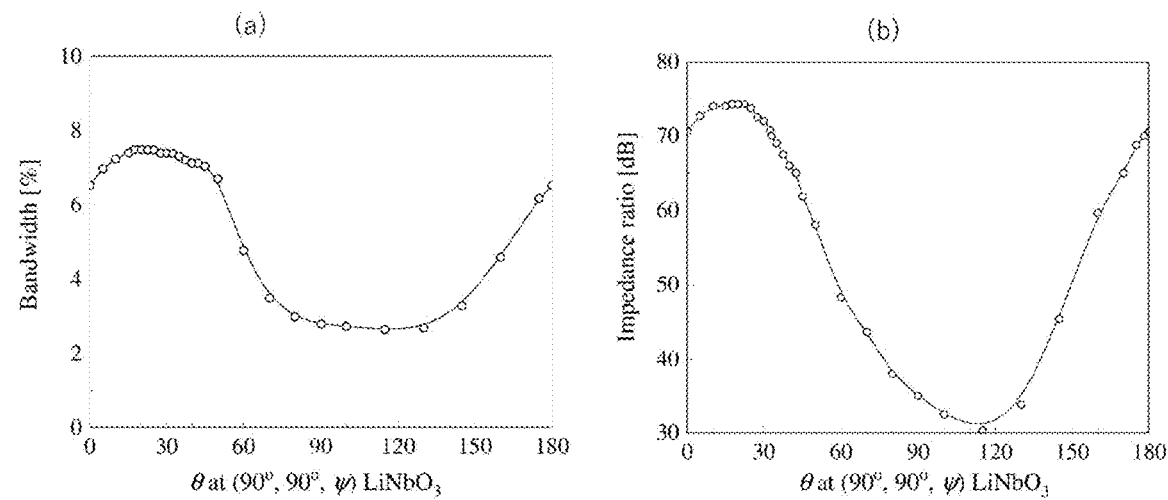
FIG. 11(a) is a graph showing the relationship between the bandwidth and the Euler angle ψ and FIG. 11(b) is a graph showing the relationship between the impedance ratio and the Euler angle ψ in a structure of the acoustic wave device shown in FIG. 1(a) with Cu (0.1λ)/(90°, 90°, ψ) LN (0.2λ)/Al (0.05λ)/W (0.05λ)/Al (0.05λ)/W (0.05λ)/Al (0.05λ)/W (0.05λ)/a Si substrate.
Figure 12:
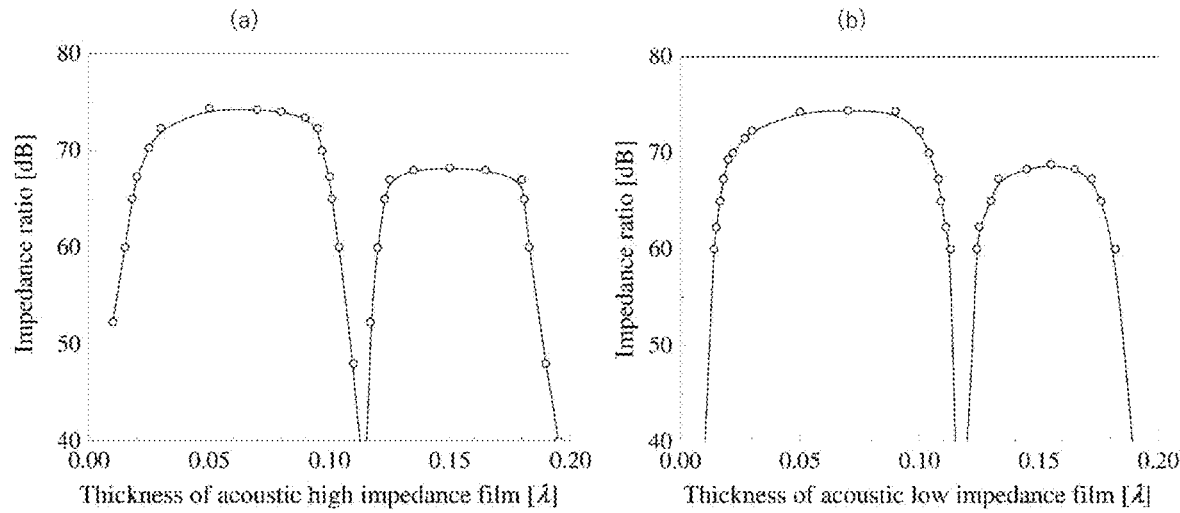
FIG. 12(a) is a graph showing the relationship between the impedance ratio and the W film thickness of the acoustic high impedance film when an Al film thickness is 0.05λ
FIG. 12(b) is a graph showing the relationship between the impedance ratio and the Al film thickness of the acoustic low impedance film when a W film thickness is 0.05λ in a structure of the acoustic wave device shown in FIG. 1(a) with Cu (0.1λ)/(90°, 90°, 42.5°) LN (0.2λ)/Al/W/Al/W/Al/W/a Si substrate.
Figure 13:
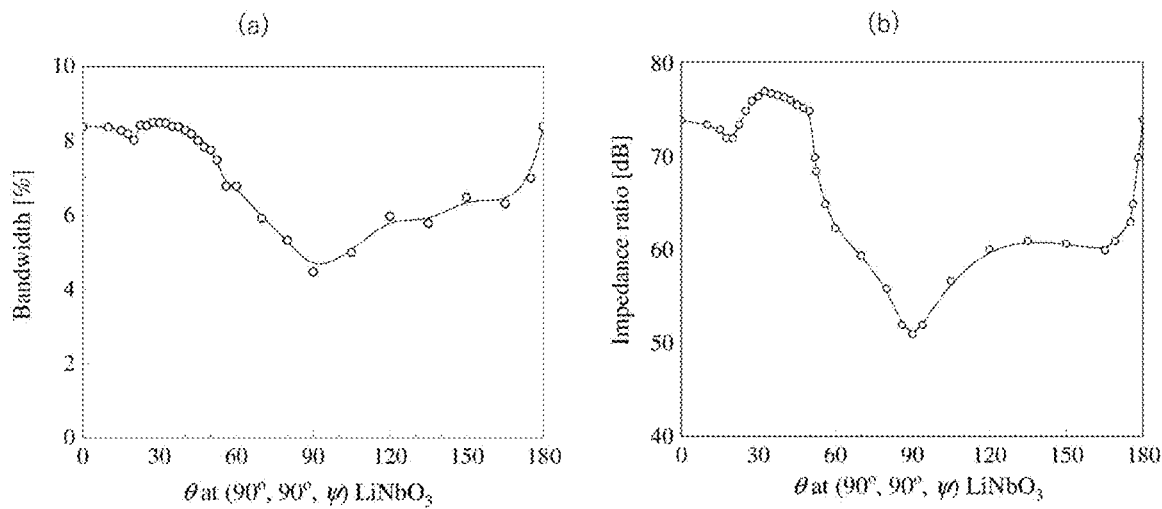
FIG. 13(a) is a graph showing the relationship between the bandwidth and the Euler angle ψ and FIG. 13(b) is a graph showing the relationship between the impedance ratio and the Euler angle ψ in a structure of the acoustic wave device shown in FIG. 1(b) with Cu (0.1λ)/(90°, 90°, ψ) LN (0.2λ)/a floating electrode/SiO$_2$ (0.05λ)/Ta (0.05λ)/SiO$_2$ (0.05λ)/Ta (0.05λ)/SiO$_2$ (0.05λ)/Ta (0.05λ)/a Si substrate.
Figure 14:
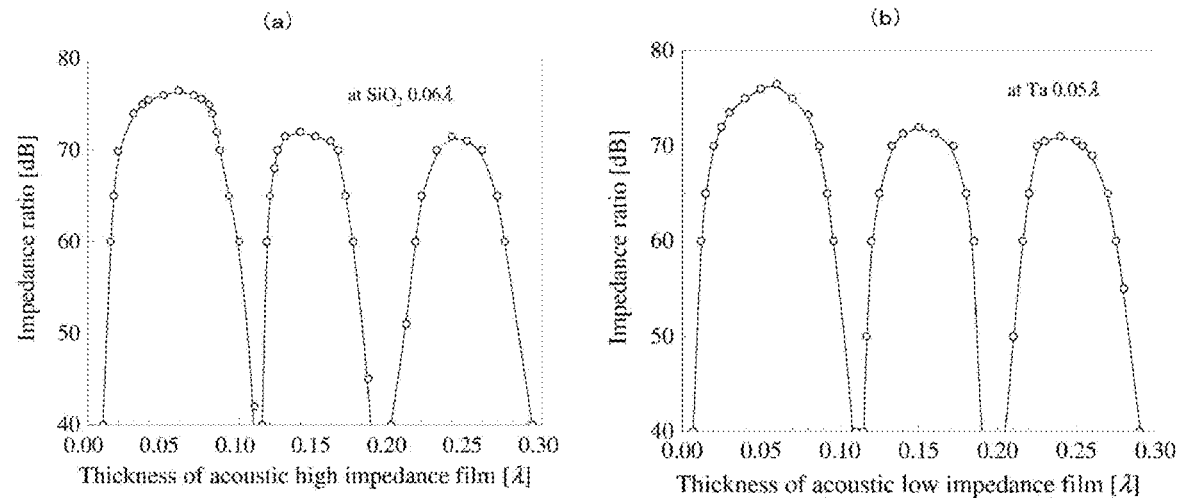
FIG. 14(a) is a graph showing the relationship between the impedance ratio and the Ta film thickness of the acoustic high impedance film when a SiO$_2$ film thickness is 0.05λ
FIG. 14(b) is a graph showing the relationship between the impedance ratio and the SiO$_2$ film thickness of the acoustic low impedance film when a Ta film thickness is 0.05λ in a structure of the acoustic wave device shown in FIG. 1(b) with Cu (0.1λ)/(90°, 90°, 42.5°) LN (0.2λ)/a floating electrode/SiO$_2$/Ta/SiO$_2$/Ta/SiO$_2$/Ta/a Si substrate.
Figure 15:
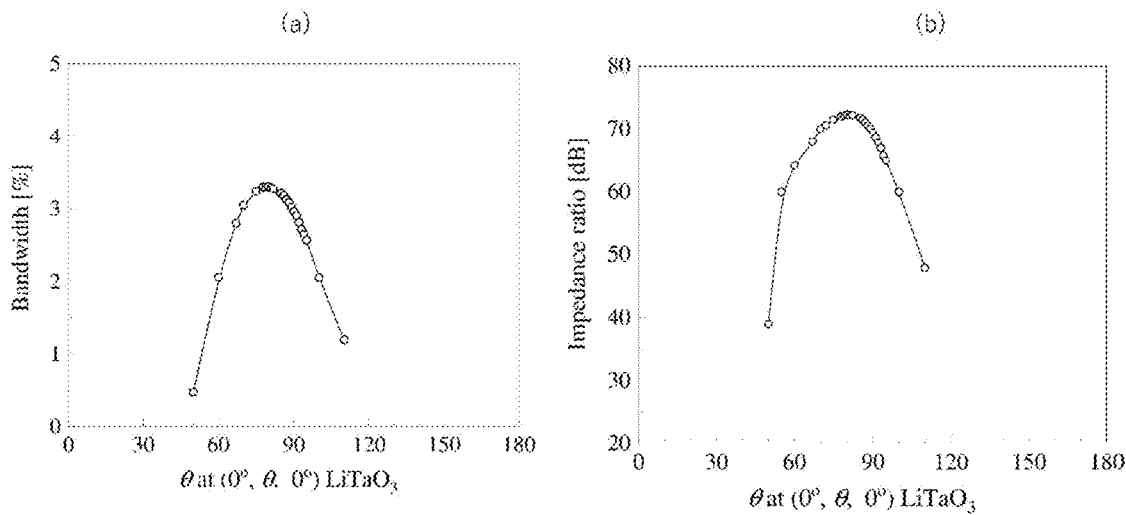
FIG. 15(a) is a graph showing the relationship between the bandwidth and the Euler angle θ and FIG. 15(b) is a graph showing the relationship between the impedance ratio and the Euler angle θ in a structure of the acoustic wave device shown in FIG. 1(a) with Cu (0.1λ)/(0°, θ, 0°) LT (0.15λ)/Al (0.05λ)/W (0.05λ)/Al (0.05λ)/W (0.05λ)/Al (0.05λ)/W (0.05λ)/a Si substrate.
Figure 16:
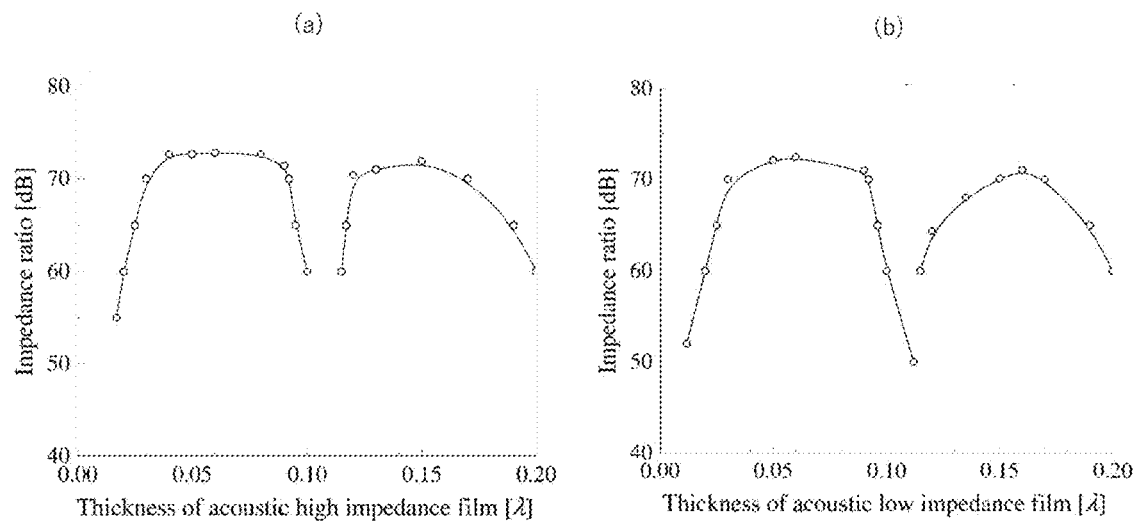
FIG. 16(a) is a graph showing the relationship between the impedance ratio and the W film thickness of the acoustic high impedance film when an Al film thickness is 0.05λ
FIG. 16(b) is a graph showing the relationship between the impedance ratio and the Al film thickness of the acoustic low impedance film when a W film thickness is 0.05λ in a structure of the acoustic wave device shown in FIG. 1(a) with Cu (0.1λ)/(0°, 85°, 0°) LT (0.15λ)/Al/W/AV/W/Al/W/a Si substrate.
Figure 17:
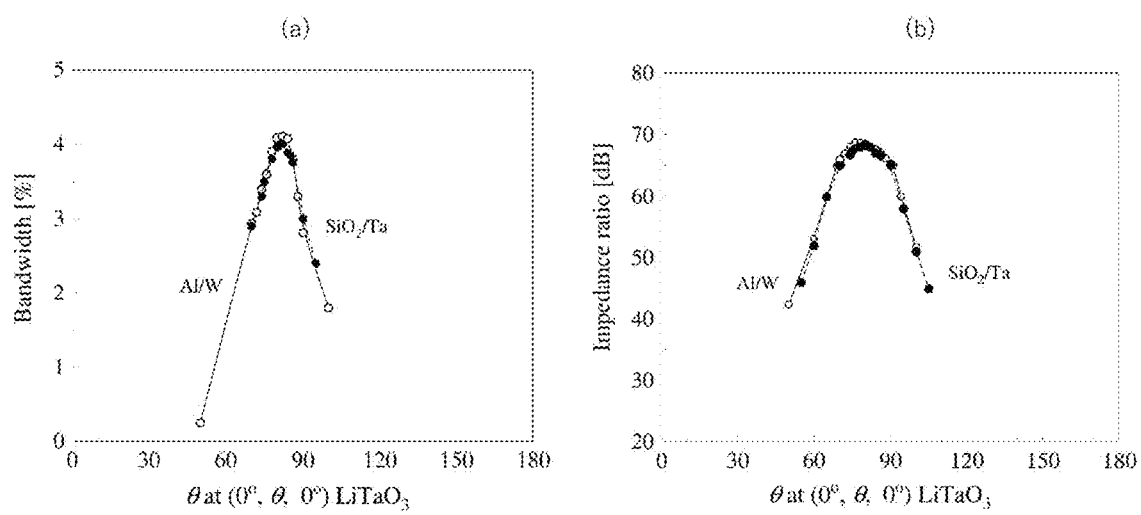
FIG. 17(a) is a graph showing the relationship between the bandwidth and the Euler angle θ and FIG. 17(b) is a graph showing the relationship between the impedance ratio and the Euler angle θ in a structure of the acoustic wave device shown in FIG. 1(b) with Cu (0.1λ)/(0°, θ, 0°) LT (0.15λ)/a floating electrode/Al (0.05λ)/W (0.05λ)/Al (0.05λ)/W (0.05λ)/Al (0.05λ)/W (0.05λ)/a Si substrate and a structure with Cu (0.1λ)/(0°, θ, 0°) LT (0.15λ)/a floating electrode/SiO$_2$ (0.05λ)/Ta (0.05λ)/SiO$_2$ (0.05λ)/Ta (0.05λ)/SiO$_2$ (0.05λ)/Ta (0.05λ)/a Si substrate.
Figure 18:
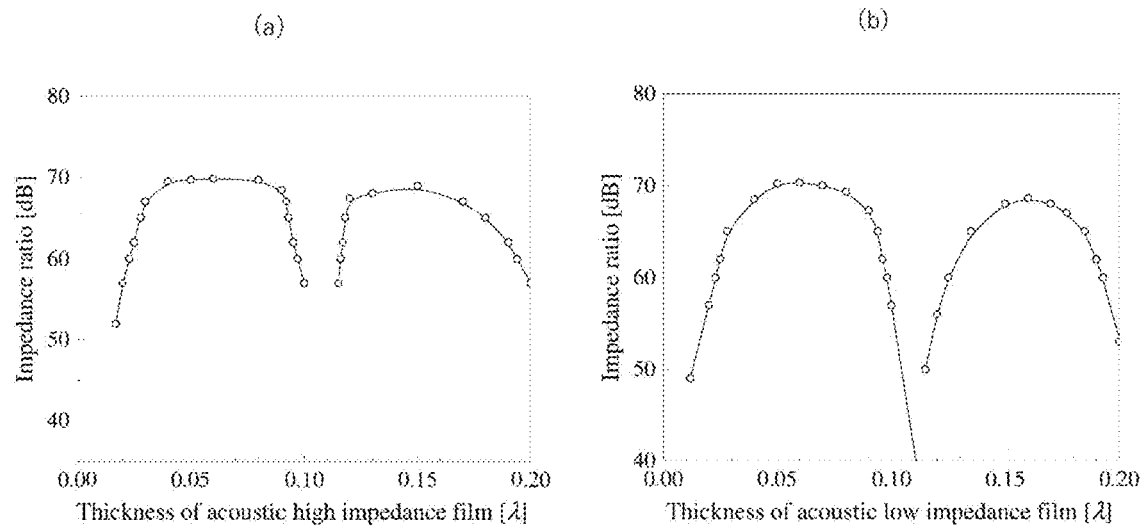
FIG. 18(a) is a graph showing the relationship between the impedance ratio and the W film thickness of the acoustic high impedance film when an Al film thickness is 0.05λ
FIG. 18(b) is a graph showing the relationship between the impedance ratio and the Al film thickness of the acoustic low impedance film when a W film thickness is 0.05λ in a structure of the acoustic wave device shown in FIG. 1(b) with Cu (0.1λ)/(0°, 85°, 0°) LT (0.15λ)/a floating electrode/Al/W/Al/W/Al/W/a Si substrate.
Figure 19:
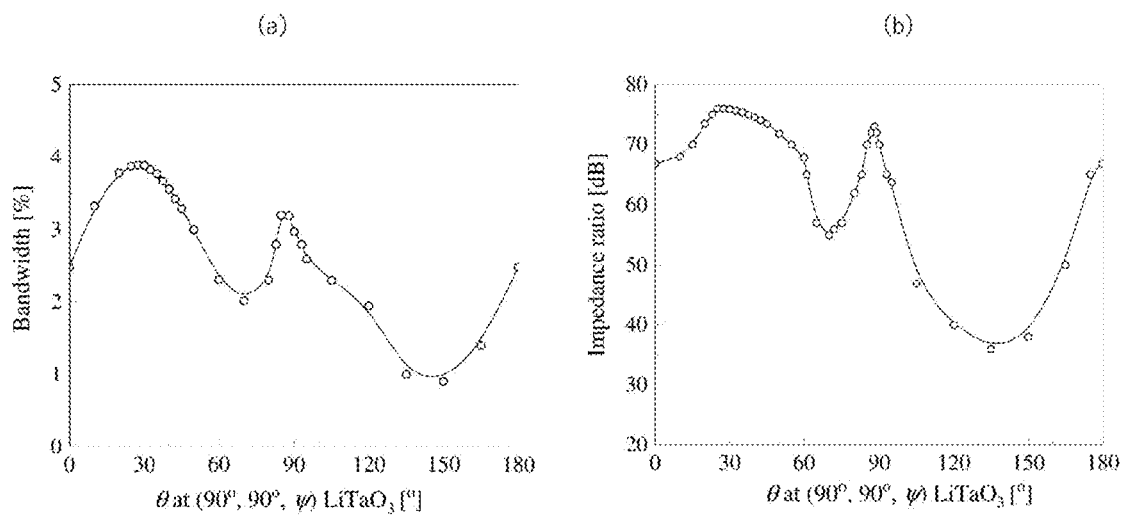
FIG. 19(a) is a graph showing the relationship between the bandwidth and the Euler angle ψ and FIG. 19(b) is a graph showing the relationship between the impedance ratio and the Euler angle ψ in a structure of the acoustic wave device shown in FIG. 1(a) with Cu (0.1λ)/(90°, 90°, ψ) LT (0.15λ)/Al (0.05λ)/W (0.05λ)/Al (0.05λ)/W (0.05λ)/Al (0.05λ)/W (0.05λ)/a Si substrate.
Figure 20:
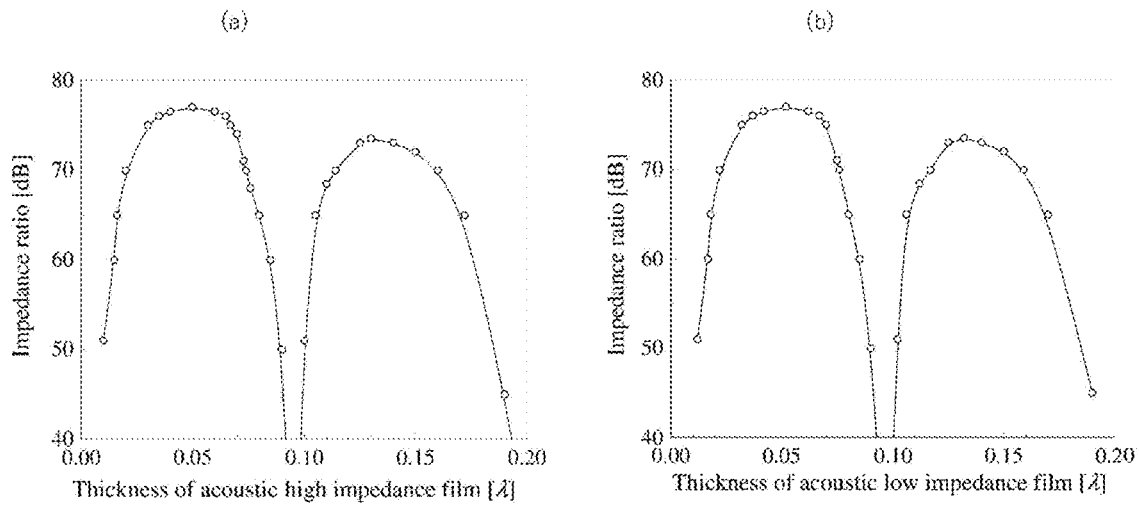
FIG. 20(a) is a graph showing the relationship between the impedance ratio and the W film thickness of the acoustic high impedance film when an Al film thickness is 0.05λ
FIG. 20(b) is a graph showing the relationship between the impedance ratio and the Al film thickness of the acoustic low impedance film when a W film thickness is 0.05λ in a structure of the acoustic wave device shown in FIG. 1(a) with Cu (0.1λ)/(90°, 90°, 35°) LT (0.15λ)/Al/W/Al/W/Al/W/a Si substrate.
Figure 21:
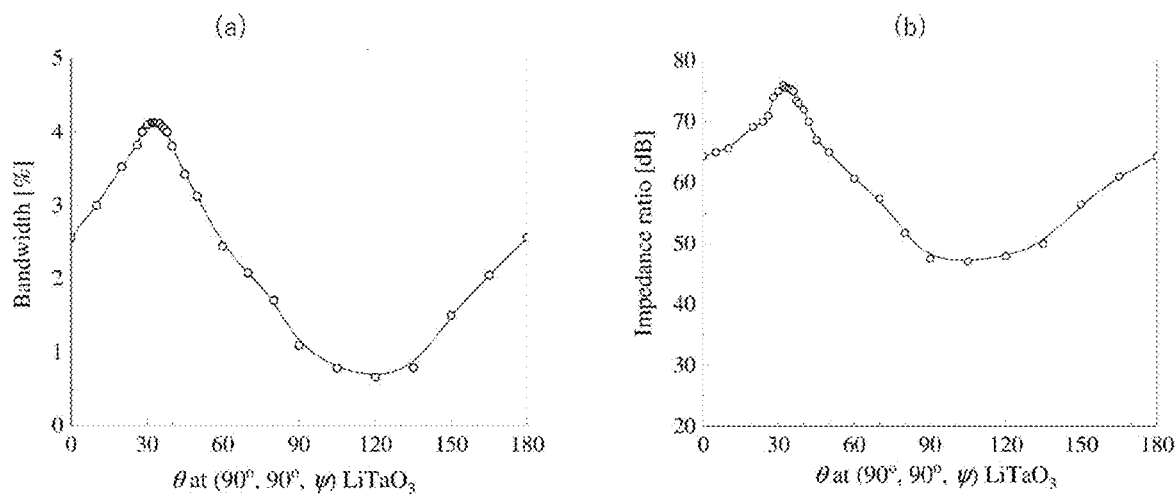
FIG. 21(a) is a graph showing the relationship between the bandwidth and the Euler angle ψ and FIG. 21(b) is a graph showing the relationship between the impedance ratio and the Euler angle ψ in a structure of the acoustic wave device shown in FIG. 1(b) with Cu (0.1λ)/(90°, 90°, ψ) LT (0.15λ)/a floating electrode/SiO$_2$ (0.05λ)/Ta (0.05λ)/SiO$_2$ (0.05λ)/Ta (0.05λ)/SiO$_2$ (0.05λ)/Ta (0.05λ)/a Si substrate.
Figure 22:
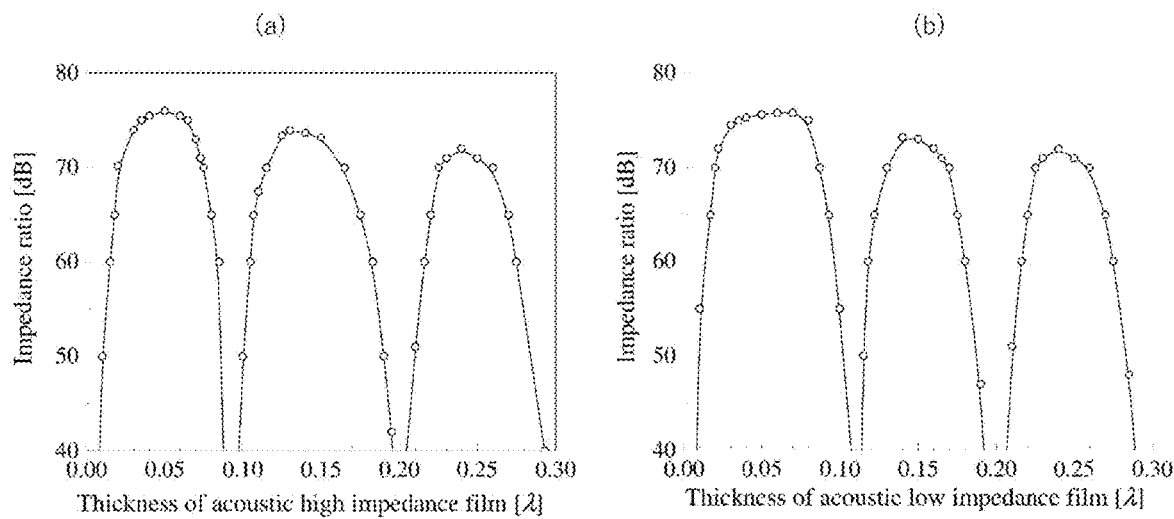
FIG. 22(a) is a graph showing the relationship between the impedance ratio and the Ta film thickness of the acoustic high impedance film when a SiO$_2$ film thickness is 0.05λ
FIG. 22(b) is a graph showing the relationship between the impedance ratio and the SiO$_2$ film thickness of the acoustic low impedance film when a Ta film thickness is 0.05λ in a structure of the acoustic wave device shown in FIG. 1(b) with Cu (0.1λ)/(90°, 90°, 35°) LT (0.15λ)/a floating electrode/SiO$_2$/Ta/SiO$_2$/Ta/SiO$_2$/Ta/a Si substrate.

The dependence of the impedance ratio on the Euler angle ψ observed when the acoustic wave device 10 shown in FIG. 1(a) had Cu (0.1λ)/(0°, 85°, ψ) LN (0.2λ)/Al (0.05λ)/W (0.05λ)/Al (0.05λ)/W (0.05λ)/Al (0.05λ)/W (0.05λ)/a Si substrate is shown in FIG. 7. As shown in FIG. 7, it has been confirmed that an impedance ratio of 65 dB or higher is achieved when ψ=−15 to 150 and an impedance ratio of 70 dB or higher is achieved when ψ=−6 to 6°.

Figure 5:
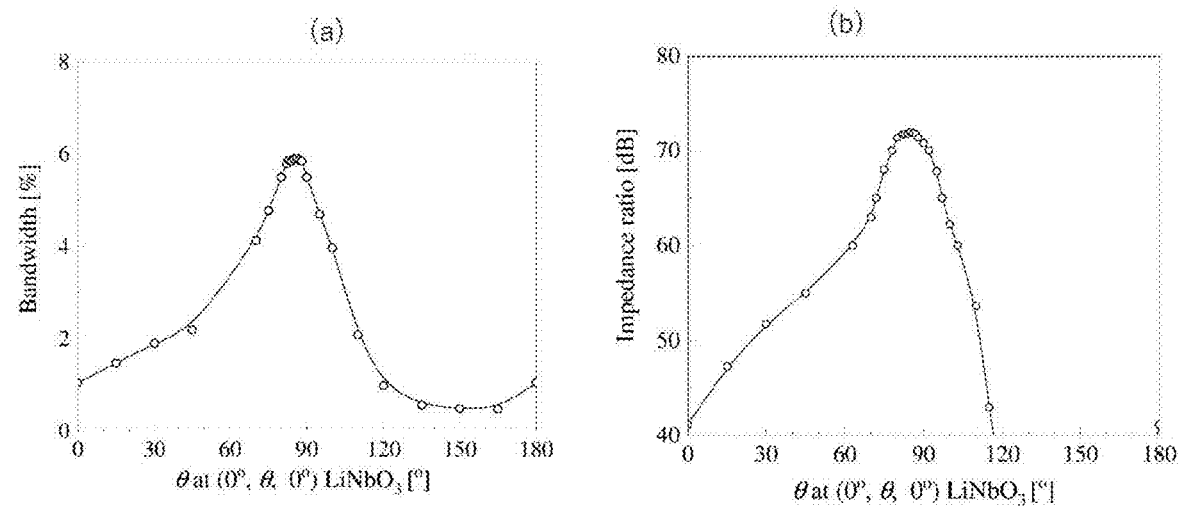
FIG. 5(a) is a graph showing the relationship between the bandwidth (Bandwidth) and the Euler angle θ and FIG. 5(b) is a graph showing the relationship between the impedance ratio (Impedance ratio) and the Euler angle θ in a structure of the acoustic wave device shown in FIG. 1(a) with Cu (0.1λ)/(0°, θ, 0°) LN (0.2λ)/Al (0.05λ)/W (0.05λ)/Al (0.05λ)/W (0.05λ)/Al (0.05λ)/W (0.05λ)/a Si substrate.

It is clear from the results shown in FIGS. 5 to 7 that the acoustic wave device 10 shown in FIG. 1(a) achieves a bandwidth of 3% or more and an impedance ratio of 60 dB or higher by using (−30 to 30°, 60 to 103°, −15 to 15°) LN as the piezoelectric substrate 11. In addition, it is clear that the acoustic wave device 10 achieves an impedance ratio of 65 dB or higher by using (−30 to 30°, 72 to 97°, −15 to 15°) LN and an impedance ratio of 70 dB or higher by using (−30 to 30°, 78 to 92°, −6 to 6°) LN.

The dependence of the impedance ratio on the W film thickness observed when the acoustic wave device 10 shown in FIG. 1(a) had Cu (0.1λ)/(0°, 85°, 0°) LN (0.2λ)/an Al film/a W film/an Al film/a W film/an Al film/a W film/a Si substrate and the film thickness of the W film, which was the acoustic high impedance film 13b, was varied with the Al film thickness being set at 0.05 wavelength is shown in FIG. 8(a). Moreover, the dependence of the impedance ratio on the Al film thickness observed when the film thickness of the Al film, which was the acoustic low impedance film 13a, was varied with the W film thickness being set at 0.05 wavelength is shown in FIG. 8(b).

As shown in FIG. 8(a), it has been confirmed that an impedance ratio of 60 dB or higher is achieved when the W film thickness of the acoustic high impedance film 13b is 0.026 to 0.108 wavelength and 0.12 to 0.187 wavelength, an impedance ratio of 65 dB or higher is achieved when the W film thickness is 0.028 to 0.107 wavelength and 0.125 to 0.185 wavelength, and an impedance ratio of 70 dB or higher is achieved when the W film thickness is 0.035 to 0.102 wavelength. Moreover, though not shown in the drawing, it has been confirmed that a high impedance ratio is also achieved when the W film thickness of the acoustic high impedance film 13b is 0.2 wavelength or more; an impedance ratio of 60 dB or higher is achieved when the W film thickness is 0.216 to 0.275 wavelength, an impedance ratio of 65 dB or higher is achieved when the W film thickness is 0.22 to 0.27 wavelength, and an impedance ratio of 70 dB or higher is achieved when the W film thickness is 0.23 to 0.26 wavelength. FIG. 8(a) shows an example in which the Al film thickness is 0.05 wavelength; when the Al film thickness was 0.02 to 0.118 wavelength, an optimum W film thickness was the same as the film thickness observed when the Al film thickness was 0.05 wavelength.

As shown in FIG. 8(b), it has been confirmed that an impedance ratio of 60 dB or higher is achieved when the Al film thickness of the acoustic low impedance film 13a is 0.02 to 0.118 wavelength and 0.129 to 0.185 wavelength, an impedance ratio of 65 dB or higher is achieved when the Al film thickness is 0.025 to 0.117 wavelength and 0.135 to 0.18 wavelength, and an impedance ratio of 70 dB or higher is achieved when the Al film thickness is 0.04 to 0.113 wavelength. Moreover, though not shown in the drawing, it has been confirmed that a high impedance ratio is also achieved when the Al film thickness of the acoustic low impedance film 13a is 0.2 wavelength or more; an impedance ratio of 60 dB or higher is achieved when the Al film thickness is 0.216 to 0.275 wavelength, an impedance ratio of 65 dB or higher is achieved when the Al film thickness is 0.22 to 0.27 wavelength, and an impedance ratio of 70 dB or higher is achieved when the Al film thickness is 0.225 to 0.254 wavelength. FIG. 8(b) shows an example in which the W film thickness is 0.05 wavelength; when the W film thickness was 0.02 to 0.118 wavelength, an optimum Al film thickness was the same as the film thickness observed when the W film thickness was 0.05 wavelength.

The dependence of the bandwidth on the Euler angle θ and the dependence of the impedance ratio on the Euler angle θ observed when the acoustic wave device 10 shown in FIG. 1(b) had Cu (0.1λ)/(0°, θ, 0°) LN (0.2λ)/a floating electrode/Al (0.05λ)/W (0.05λ)/Al (0.05λ)/W (0.05λ)/Al (0.05λ)/W (0.05λ)/a Si substrate are shown in FIGS. 9(a) and (b), respectively. It is to be noted that the surface of the Al film, which is the first layer of the acoustic multilayer film 13, is subjected to alumite treatment to make it insulated. When an Al electrode which is not subjected to alumite treatment is used in the first layer, the Al film that is the first layer may double as the floating electrode. As shown in FIGS. 9(a) and (b), it has been confirmed that a bandwidth of 4% or more and an impedance ratio of 60 dB or higher are achieved when θ=64 to 98°, an impedance ratio of 65 dB or higher is achieved when θ=68 to 95°, and an impedance ratio of 70 dB or higher is achieved when θ=72 to 92°.

The dependence of the impedance ratio on the W film thickness observed when the acoustic wave device 10 shown in FIG. 1(b) had Cu (0.1λ)/(0°, 85°, 0°) LN (0.2λ)/a floating electrode/an Al film/a W film/an Al film/a W film/an Al film/a W film/a Si substrate and the film thickness of the W film, which was the acoustic high impedance film 13b, was varied with the Al film thickness being set at 0.05 wavelength is shown in FIG. 10(a). Moreover, the dependence of the impedance ratio on the Al film thickness observed when the film thickness of the Al film, which was the acoustic low impedance film 13a, was varied with the W film thickness being set at 0.05 wavelength is shown in FIG. 10(b).

As shown in FIG. 10(a), it has been confirmed that an impedance ratio of 60 dB or higher is achieved when the W film thickness of the acoustic high impedance film 13b is 0.02 to 0.105 wavelength and 0.121 to 0.183 wavelength, an impedance ratio of 65 dB or higher is achieved when the W film thickness is 0.027 to 0.103 wavelength and 0.124 to 0.18 wavelength, and an impedance ratio of 70 dB or higher is achieved when the W film thickness is 0.036 to 0.095 wavelength. Moreover, though not shown in the drawing, it has been confirmed that a high impedance ratio is also achieved when the W film thickness of the acoustic high impedance film 13b is 0.2 wavelength or more; an impedance ratio of 60 dB or higher is achieved when the W film thickness is 0.216 to 0.275 wavelength, an impedance ratio of 65 dB or higher is achieved when the W film thickness is 0.22 to 0.27 wavelength, and an impedance ratio of 70 dB or higher is achieved when the W film thickness is 0.23 to 0.26 wavelength. FIG. 10(a) shows an example in which the Al film thickness is 0.05 wavelength; when the Al film thickness was 0.02 to 0.113 wavelength, an optimum W film thickness was the same as the film thickness observed when the Al film thickness was 0.05 wavelength.

As shown in FIG. 10(b), it has been confirmed that an impedance ratio of 60 dB or higher is achieved when the Al film thickness of the acoustic low impedance film 13a is 0.02 to 0.113 wavelength and 0.132 to 0.185 wavelength, an impedance ratio of 65 dB or higher is achieved when the Al film thickness is 0.024 to 0.112 wavelength and 0.135 to 0.18 wavelength, and an impedance ratio of 70 dB or higher is achieved when the Al film thickness is 0.038 to 0.104 wavelength. Moreover, though not shown in the drawing, it has been confirmed that a high impedance ratio is also achieved when the Al film thickness of the acoustic low impedance film 13a is 0.2 wavelength or more; an impedance ratio of 60 dB or higher is achieved when the Al film thickness is 0.216 to 0.275 wavelength, an impedance ratio of 65 dB or higher is achieved when the Al film thickness is 0.22 to 0.27 wavelength, and an impedance ratio of 70 dB or higher is achieved when the Al film thickness is 0.225 to 0.254 wavelength. FIG. 10(b) shows an example in which the W film thickness is 0.05 wavelength; when the W film thickness was 0.02 to 0.105 wavelength, an optimum Al film thickness was the same as the film thickness observed when the W film thickness was 0.05 wavelength.

The dependence of the bandwidth on the Euler angle ψ and the dependence of the impedance ratio on the Euler angle ψ observed when the acoustic wave device 10 shown in FIG. 1(a) had Cu (0.1λ)/(90°, 90°, ψ) LN (0.2λ)/Al (0.05λ)/W (0.05λ)/Al (0.05λ)/W (0.05λ)/Al (0.05λ)/W (0.05λ)/a Si substrate are shown in FIGS. 11(a) and (b), respectively. As shown in FIGS. 11(a) and (b), it has been confirmed that a bandwidth of 7% or more and an impedance ratio of 60 dB or higher are achieved when ψ=160 to 180° and 0 to 48°, that is, −20 to 48°, an impedance ratio of 65 dB or higher is achieved when ψ=170 to 180° and 0 to 43°, that is, −10 to 43°, and an impedance ratio of 70 dB or higher is achieved when ψ=178 to 180° and 0 to 33°, that is, −2 to 33°. Moreover, as for the Euler angles φ and θ, though not shown in the drawing, it has been confirmed that almost the same values are achieved at 90°±6°; an impedance ratio of 60 dB or higher is achieved at (90°±6°, 90°±6°, −20 to 48°), an impedance ratio of 65 dB or higher is achieved at (90°±6°, 90°±6°, −10 to 43°), and an impedance ratio of 70 dB or higher is achieved at (90°±6°, 90°±6°, −2 to 33°).

The dependence of the impedance ratio on the W film thickness observed when the acoustic wave device 10 shown in FIG. 1(a) had Cu (0.1λ)/(90°, 90°, 42.5°) LN (0.2λ)/an Al film/a W film/an Al film/a W film/an Al film/a W film/a Si substrate and the film thickness of the W film, which was the acoustic high impedance film 13b, was varied with the Al film thickness being set at 0.05 wavelength is shown in FIG. 12(a). Moreover, the dependence of the impedance ratio on the Al film thickness observed when the film thickness of the Al film, which was the acoustic low impedance film 13a, was varied with the W film thickness being set at 0.05 wavelength is shown in FIG. 12(b).

As shown in FIG. 12(a), it has been confirmed that an impedance ratio of 60 dB or higher is achieved when the W film thickness of the acoustic high impedance film 13b is 0.015 to 0.104 wavelength and 0.12 to 0.183 wavelength, an impedance ratio of 65 dB or higher is achieved when the W film thickness is 0.018 to 0.101 wavelength and 0.123 to 0.181 wavelength, and an impedance ratio of 70 dB or higher is achieved when the W film thickness is 0.024 to 0.097 wavelength. Moreover, though not shown in the drawing, it has been confirmed that a high impedance ratio is also achieved when the W film thickness of the acoustic high impedance film 13b is 0.2 wavelength or more; an impedance ratio of 60 dB or higher is achieved when the W film thickness is 0.216 to 0.275 wavelength, an impedance ratio of 65 dB or higher is achieved when the W film thickness is 0.22 to 0.27 wavelength, and an impedance ratio of 70 dB or higher is achieved when the W film thickness is 0.23 to 0.26 wavelength. FIG. 12(a) shows an example in which the Al film thickness is 0.05 wavelength; when the Al film thickness was 0.014 to 0.113 wavelength, an optimum W film thickness was the same as the film thickness observed when the Al film thickness was 0.05 wavelength.

As shown in FIG. 12(b), it has been confirmed that an impedance ratio of 60 dB or higher is achieved when the Al film thickness of the acoustic low impedance film 13a is 0.014 to 0.113 wavelength and 0.124 to 0.182 wavelength, an impedance ratio of 65 dB or higher is achieved when the Al film thickness is 0.016 to 0.109 wavelength and 0.13 to 0.176 wavelength, and an impedance ratio of 70 dB or higher is achieved when the Al film thickness is 0.022 to 0.104 wavelength. Moreover, though not shown in the drawing, it has been confirmed that a high impedance ratio is also achieved when the Al film thickness of the acoustic low impedance film 13a is 0.2 wavelength or more; an impedance ratio of 60 dB or higher is achieved when the Al film thickness is 0.216 to 0.275 wavelength, an impedance ratio of 65 dB or higher is achieved when the Al film thickness is 0.22 to 0.27 wavelength, and an impedance ratio of 70 dB or higher is achieved when the Al film thickness is 0.225 to 0.254 wavelength. FIG. 12(b) shows an example in which the W film thickness is 0.05 wavelength; when the W film thickness was 0.015 to 0.104 wavelength, an optimum Al film thickness was the same as the film thickness observed when the W film thickness was 0.05 wavelength.

The dependence of the bandwidth on the Euler angle ψ and the dependence of the impedance ratio on the Euler angle ψ observed when the acoustic wave device 10 shown in FIG. 1(b) had Cu (0.1λ)/(90°, 90°, ψ) LN (0.2λ)/a floating electrode/SiO₂ (0.05λ)/Ta (0.05λ)/SiO₂ (0.05λ)/Ta (0.05λ)/SiO₂ (0.05λ)/Ta (0.05λ)/a Si substrate are shown in FIGS. 13(a) and (b), respectively. As shown in FIGS. 13(a) and (b), it has been confirmed that a bandwidth of 7% or more and an impedance ratio of 65 dB or higher are achieved when ψ=176 to 180θ and 0 to 56°, that is, −4 to 56°, an impedance ratio of 70 dB or higher is achieved when ψ=178 to 180° and 0 to 52°, that is, −2 to 52°, and an impedance ratio of 75 dB or higher is achieved when ψ=25 to 50°.

Moreover, as for the Euler angles φ and θ, though not shown in the drawing, it has been confirmed that almost the same values are achieved at 90°±6°; an impedance ratio of 65 dB or higher is achieved at (90°±6°, 90°±6°, −4 to 56°), an impedance ratio of 70 dB or higher is achieved at (90°±6°, 90°±6°, −2 to 52°), and an impedance ratio of 75 dB or higher is achieved at (90°±6°, 90°±6°, 25 to 50°).

The dependence of the impedance ratio on the Ta film thickness observed when the acoustic wave device 10 shown in FIG. 1(b) had Cu (0.1λ)/(90°, 90°, 42.5°) LN (0.2λ)/a floating electrode/a SiO₂ film/a Ta film/a SiO₂ film/a Ta film/a SiO₂ film/a Ta film/a Si substrate and the film thickness of the Ta film, which was the acoustic high impedance film 13b, was varied with the SiO₂ film thickness being set at 0.05 wavelength is shown in FIG. 14(a). Moreover, the dependence of the impedance ratio on the SiO₂ film thickness observed when the film thickness of the SiO₂ film, which was the acoustic low impedance film 13a, was varied with the Ta film thickness being set at 0.05 wavelength is shown in FIG. 14(b).

As shown in FIG. 14(a), it has been confirmed that an impedance ratio of 60 dB or higher is achieved when the Ta film thickness of the acoustic high impedance film 13b is 0.015 to 0.1 wavelength, 0.118 to 0.175 wavelength, and 0.216 to 0.275 wavelength, an impedance ratio of 65 dB or higher is achieved when the Ta film thickness is 0.017 to 0.093 wavelength, 0.12 to 0.17 wavelength, and 0.22 to 0.27 wavelength, an impedance ratio of 70 dB or higher is achieved when the Ta film thickness is 0.02 to 0.087 wavelength, 0.125 to 0.165 wavelength, and 0.23 to 0.26 wavelength, and an impedance ratio of 75 dB or higher is achieved when the Ta film thickness is 0.036 to 0.082 wavelength. FIG. 14(a) shows an example in which the SiO$_2$ film thickness is 0.05 wavelength; when the SiO$_2$ film thickness was 0.012 to 0.096 wavelength, an optimum Ta film thickness was the same as the film thickness observed when the SiO$_2$ film thickness was 0.05 wavelength.

Moreover, as shown in FIG. 14(b), it has been confirmed that an impedance ratio of 60 dB or higher is achieved when the SiO$_2$ film thickness of the acoustic low impedance film 13a is 0.012 to 0.096 wavelength, 0.12 to 0.185 wavelength, and 0.216 to 0.275 wavelength, an impedance ratio of 65 dB or higher is achieved when the SiO$_2$ film thickness is 0.015 to 0.092 wavelength, 0.125 to 0.18 wavelength, and 0.22 to 0.27 wavelength, an impedance ratio of 70 dB or higher is achieved when the SiO$_2$ film thickness is 0.02 to 0.087 wavelength, 0.133 to 0.172 wavelength, and 0.225 to 0.254 wavelength, and an impedance ratio of 75 dB or higher is achieved when the SiO$_2$ film thickness is 0.04 to 0.07 wavelength. FIG. 14(b) shows an example in which the Ta film thickness is 0.05 wavelength; when the Ta film thickness was 0.015 to 0.1 wavelength, an optimum SiO$_2$ film thickness was the same as the film thickness observed when the Ta film thickness was 0.05 wavelength.

[When a LT Substrate was Used]

The dependence of the bandwidth on the Euler angle θ and the dependence of the impedance ratio on the Euler angle θ observed when the acoustic wave device 10 shown in FIG. 1(a) had Cu (0.1λ)/(0°, θ, 0°) LT (0.15λ)/Al (0.05λ)/W (0.05λ)/Al (0.05λ)/W (0.05λ)/Al (0.05λ)/W (0.05λ)/a Si substrate are shown in FIGS. 15(a) and (b), respectively. As shown in FIGS. 15(a) and (b), it has been confirmed that a bandwidth of 2% or more and an impedance ratio of 60 dB or higher are achieved when θ=55 to 100°, an impedance ratio of 65 dB or higher is achieved when θ=61 to 95°, and an impedance ratio of 70 dB or higher is achieved when θ=70 to 89°.

Moreover, since the crystal structure of LT is the same as the crystal structure of LN, the relationship between φ and ψ in (φ, θ, ψ) LT is the same as that in LN. Therefore, when LT is used, an impedance ratio of 60 dB or higher is achieved with (−30 to 30°, 55 to 100°, −15 to 15°) LT, an impedance ratio of 65 dB or higher is achieved with (−30 to 30°, 61 to 95°, −15 to 15°) LT, and an impedance ratio of 70 dB or higher is achieved with (−30 to 30°, 70 to 89°, −6 to 6°) LT.

The dependence of the impedance ratio on the W film thickness observed when the acoustic wave device 10 shown in FIG. 1(a) had Cu (0.1λ)/(0°, 85°, 0°) LT (0.15λ)/an Al film/a W film/an Al film/a W film/an Al film/a W film/a Si substrate and the film thickness of the W film, which was the acoustic high impedance film 13b, was varied with the Al film thickness being set at 0.05 wavelength is shown in FIG. 16(a). Moreover, the dependence of the impedance ratio on the Al film thickness observed when the film thickness of the Al film, which was the acoustic low impedance film 13a, was varied with the W film thickness being set at 0.05 wavelength is shown in FIG. 16(b).

As shown in FIG. 16(a), it has been confirmed that an impedance ratio of 60 dB or higher is achieved when the W film thickness of the acoustic high impedance film 13b is 0.02 to 0.10 wavelength and 0.115 to 0.2 wavelength, an impedance ratio of 65 dB or higher is achieved when the W film thickness is 0.025 to 0.095 wavelength and 0.117 to 0.19 wavelength, and an impedance ratio of 70 dB or higher is achieved when the W film thickness is 0.03 to 0.092 wavelength and 0.12 to 0.17 wavelength. Moreover, though not shown in the drawing, it has been confirmed that a high impedance ratio is also achieved when the W film thickness of the acoustic high impedance film 13b is 0.2 wavelength or more; an impedance ratio of 60 dB or higher is achieved when the W film thickness is 0.216 to 0.275 wavelength, an impedance ratio of 65 dB or higher is achieved when the W film thickness is 0.22 to 0.27 wavelength, and an impedance ratio of 70 dB or higher is achieved when the W film thickness is 0.225 to 0.26 wavelength. FIG. 16(a) shows an example in which the Al film thickness is 0.05 wavelength; when the Al film thickness was 0.02 to 0.1 wavelength, an optimum W film thickness was the same as the film thickness observed when the Al film thickness was 0.05 wavelength.

As shown in FIG. 16(b), it has been confirmed that an impedance ratio of 60 dB or higher is achieved when the Al film thickness of the acoustic low impedance film 13a is 0.02 to 0.1 wavelength and 0.115 to 0.2 wavelength, an impedance ratio of 65 dB or higher is achieved when the Al film thickness is 0.025 to 0.095 wavelength and 0.12 to 0.19 wavelength, and an impedance ratio of 70 dB or higher is achieved when the Al film thickness is 0.03 to 0.12 wavelength and 0.12 to 0.15 wavelength. Moreover, though not shown in the drawing, it has been confirmed that a high impedance ratio is also achieved when the Al film thickness of the acoustic high impedance film 13b is 0.2 wavelength or more; an impedance ratio of 60 dB or higher is achieved when the Al film thickness is 0.216 to 0.275 wavelength, an impedance ratio of 65 dB or higher is achieved when the Al film thickness is 0.22 to 0.27 wavelength, and an impedance ratio of 70 dB or higher is achieved when the Al film thickness is 0.225 to 0.26 wavelength. FIG. 16(b) shows an example in which the W film thickness is 0.05 wavelength; when the W film thickness was 0.02 to 0.1 wavelength, an optimum Al film thickness was the same as the film thickness observed when the W film thickness was 0.05 wavelength.

The dependence of the bandwidth on the Euler angle θ and the dependence of the impedance ratio on the Euler angle θ observed when the acoustic wave device 10 shown in FIG. 1(b) had Cu (0.1λ)/(0°, θ, 0°) LT (0.15λ)/a floating electrode/Al (0.05λ)/W (0.05λ)/Al (0.05λ)/W (0.05λ)/Al (0.05λ)/W (0.05λ)/a Si substrate and Cu (0.1λ)/(0°, θ, 0°) LT (0.15λ)/a floating electrode/SiO$_2$ (0.05λ)/Ta (0.05λ)/SiO$_2$ (0.05λ)/Ta (0.05λ)/SiO$_2$ (0.05λ)/Ta (0.05λ)/a Si substrate are shown in FIGS. 17(a) and (b), respectively. As shown in FIGS. 17(a) and (b), it has been confirmed that there is almost no difference in the dependence of the bandwidth on θ and the dependence of the impedance ratio on θ between a case where a combination of the acoustic low impedance film 13a and the acoustic high impedance film 13b is a combination of an Al film and a W film and a case where a combination of the acoustic low impedance film 13a and the acoustic high impedance film 13b is a combination of a SiO$_2$ film and a Ta film. Moreover, it has been confirmed that, in either of the combinations, a bandwidth of 2% or more and an impedance ratio of 60 dB or higher are achieved when θ=65 to 94° and an impedance ratio of 65 dB or higher is achieved when θ=69 to 91°.

The dependence of the impedance ratio on the W film thickness observed when the acoustic wave device 10 shown in FIG. 1(b) had Cu (0.1λ)/(0°, 85°, 0°) LT (0.15λ)/a floating electrode/an Al film/a W film/an Al film/a W film/an Al film/a W film/a Si substrate and the film thickness of the W film, which was the acoustic high impedance film 13b, was varied with the Al film thickness being set at 0.05 wavelength are shown in FIG. 18(a). Moreover, the dependence of the impedance ratio on the Al film thickness observed when the film thickness of the Al film, which was the acoustic low impedance film 13a, was varied with the W film thickness being set at 0.05 wavelength is shown in FIG. 18(b).

As shown in FIG. 18(a), it has been confirmed that an impedance ratio of 60 dB or higher is achieved when the W film thickness of the acoustic high impedance film 13b is 0.023 to 0.097 wavelength and 0.116 to 0.194 wavelength and an impedance ratio of 65 dB or higher is achieved when the W film thickness is 0.028 to 0.093 wavelength and 0.118 to 0.18 wavelength. Moreover, though not shown in the drawing, it has been confirmed that a high impedance ratio is also achieved when the W film thickness of the acoustic high impedance film 13b is 0.2 wavelength or more; an impedance ratio of 60 dB or higher is achieved when the W film thickness is 0.216 to 0.275 wavelength and an impedance ratio of 65 dB or higher is achieved when the W film thickness is 0.22 to 0.27 wavelength. FIG. 18(a) shows an example in which the Al film thickness is 0.05 wavelength; when the Al film thickness was 0.023 to 0.098 wavelength, an optimum W film thickness was the same as the film thickness observed when the Al film thickness was 0.05 wavelength.

As shown in FIG. 18(b), it has been confirmed that an impedance ratio of 60 dB or higher is achieved when the Al film thickness of the acoustic low impedance film 13a is 0.023 to 0.098 wavelength and 0.125 to 0.193 wavelength and an impedance ratio of 65 dB or higher is achieved when the Al film thickness is 0.028 to 0.094 wavelength and 0.135 to 0.185 wavelength. Moreover, though not shown in the drawing, it has been confirmed that a high impedance ratio is also achieved when the Al film thickness of the acoustic high impedance film 13b is 0.2 wavelength or more; an impedance ratio of 60 dB or higher is achieved when the Al film thickness is 0.216 to 0.275 wavelength and an impedance ratio of 65 dB or higher is achieved when the Al film thickness is 0.22 to 0.27 wavelength. FIG. 18(b) shows an example in which the W film thickness is 0.05 wavelength; when the W film thickness was 0.023 to 0.097 wavelength, an optimum Al film thickness was the same as the film thickness observed when the W film thickness was 0.05 wavelength.

The dependence of the bandwidth on the Euler angle θ and the dependence of the impedance ratio on the Euler angle θ when the acoustic wave device 10 shown in FIG. 1(a) had Cu (0.1λ)/(90°, 90°, ψ) LT (0.15λ)/Al (0.05λ)/W (0.05λ)/Al (0.05λ)/W (0.05λ)/Al (0.05λ)/W (0.05λ)/a Si substrate are shown in FIGS. 19(a) and (b), respectively. As shown in FIGS. 19(a) and (b), it has been confirmed that a bandwidth of 2.3% or more and an impedance ratio of 65 dB or higher are achieved when ψ=175 to 180°, 0 to 61°, and 83 to 93°, that is, when ψ=−5 to 61° and 83 to 93°, an impedance ratio of 70 dB or higher is achieved when ψ=15 to 55° and 85 to 91°, and an impedance ratio of 75 dB or higher is achieved when ψ=23 to 38°.

Moreover, as for the Euler angles φ and θ, though not shown in the drawing, it has been confirmed that almost the same values are achieved at 90°±6°; an impedance ratio of 65 dB or higher is achieved at (90°±6°, 90°±6°, −5 to 61°) and (90°±6° 90°±6°, 83 to 93°), an impedance ratio of 70 dB or higher is achieved at (90°±6°, 90°±6°, 15 to 55°) and (90°±6°, 90°±6°, 85 to 91°), and an impedance ratio of 75 dB or higher is achieved at (90°±6°, 90°±6°, 23 to 83°).

The dependence of the impedance ratio on the W film thickness observed when the acoustic wave device 10 shown in FIG. 1(a) had Cu (0.1λ)/(90°, 90°, 35°) LT (0.15λ)/an Al film/a W film/an Al film/a W film/an Al film/a W film/a Si substrate and the film thickness of the W film, which was the acoustic high impedance film 13b, was varied with the Al film thickness being set at 0.05 wavelength is shown in FIG. 20(a). Moreover, the dependence of the impedance ratio on the Al film thickness observed when the film thickness of the Al film, which was the acoustic low impedance film 13a, was varied with the W film thickness being set at 0.05 wavelength is shown in FIG. 20(b).

As shown in FIG. 20(a), it has been confirmed that an impedance ratio of 65 dB or higher is achieved when the W film thickness of the acoustic high impedance film 13b is 0.016 to 0.08 wavelength and 0.105 to 0.172 wavelength, an impedance ratio of 70 dB or higher is achieved when the W film thickness is 0.02 to 0.074 wavelength and 0.114 to 0.16 wavelength, and an impedance ratio of 75 dB or higher is achieved when the W film thickness is 0.03 to 0.067 wavelength. Moreover, though not shown in the drawing, it has been confirmed that a high impedance ratio is also achieved when the W film thickness of the acoustic high impedance film 13b is 0.2 wavelength or more; an impedance ratio of 60 dB or higher is achieved when the W film thickness is 0.216 to 0.275 wavelength, an impedance ratio of 65 dB or higher is achieved when the W film thickness is 0.22 to 0.27 wavelength, and an impedance ratio of 70 dB or higher is achieved when the W film thickness is 0.225 to 0.26 wavelength. FIG. 20(a) shows an example in which the Al film thickness is 0.05 wavelength; when the Al film thickness was 0.018 to 0.08 wavelength, an optimum W film thickness was the same as the film thickness observed when the Al film thickness was 0.05 wavelength.

As shown in FIG. 20(b), it has been confirmed that an impedance ratio of 65 dB or higher is achieved when the Al film thickness of the acoustic low impedance film 13a is 0.018 to 0.08 wavelength and 0.106 to 0.17 wavelength, an impedance ratio of 70 dB or higher is achieved when the Al film thickness is 0.022 to 0.076 wavelength and 0.117 to 0.16 wavelength, and an impedance ratio of 75 dB or higher is achieved when the Al film thickness is 0.032 to 0.07 wavelength. Moreover, though not shown in the drawing, it has been confirmed that a high impedance ratio is also achieved when the Al film thickness of the acoustic high impedance film 13b is 0.2 wavelength or more; an impedance ratio of 60 dB or higher is achieved when the Al film thickness is 0.216 to 0.275 wavelength, an impedance ratio of 65 dB or higher is achieved when the Al film thickness is 0.22 to 0.27 wavelength, and an impedance ratio of 70 dB or higher is achieved when the Al film thickness is 0.225 to 0.26 wavelength. FIG. 20(b) shows an example in which the W film thickness is 0.05 wavelength; when the W film thickness was 0.016 to 0.08 wavelength, an optimum Al film thickness was the same as the film thickness observed when the W film thickness was 0.05 wavelength.

The dependence of the bandwidth on the Euler angle ψ and the dependence of the impedance ratio on the Euler angle ψ observed when the acoustic wave device 10 shown in FIG. 1(b) had Cu (0.1λ)/(90°, 90°, ψ) LT (0.15λ)/a floating electrode/SiO$_2$ (0.05λ)/Ta (0.05λ)/SiO$_2$ (0.05λ)/Ta (0.05λ)/SiO$_2$ (0.05λ)/Ta (0.05λ)/a Si substrate are shown in FIGS. 21(a) and (b), respectively. As shown in FIGS. 21(a) and (b), it has been confirmed that a bandwidth of 7% or more and an impedance ratio of 65 dB or higher are achieved when ψ=176 to 180° and 0 to 56°, that is, −4 to 56°, an impedance ratio of 70 dB or higher is achieved when ψ=178 to 180° and 0 to 52°, that is, −2 to 52°, and an impedance ratio of 75 dB or higher is achieved when ψ=25 to 50°.

Moreover, as for the Euler angles ϕ and θ, though not shown in the drawing, it has been confirmed that almost the same values are achieved at 90°±6°; an impedance ratio of 65 dB or higher is achieved at (90°±6°, 90°±6°, −4 to 56°), an impedance ratio of 70 dB or higher is achieved at (90°±6°, 90°±6°, −2 to 52°), and an impedance ratio of 75 dB or higher is achieved at (90°±6°, 90°±6°, 25 to 50°).

The dependence of the impedance ratio on the Ta film thickness observed when the acoustic wave device 10 shown in FIG. 1(b) had Cu (0.1λ)/(90°, 90°, 35°) LT (0.15λ)/a floating electrode/a SiO$_2$ film/a Ta film/a SiO$_2$ film/a Ta film/a SiO$_2$ film/a Ta film/a Si substrate and the film thickness of the Ta film, which was the acoustic high impedance film 13b, was varied with the SiO$_2$ film thickness being set at 0.05 wavelength is shown in FIG. 22(a). Moreover, the dependence of the impedance ratio on the SiO$_2$ film thickness observed when the film thickness of the SiO$_2$ film, which was the acoustic low impedance film 13a, was varied with the Ta film thickness being set at 0.05 wavelength is shown in FIG. 22(b).

As shown in FIG. 22(a), it has been confirmed that an impedance ratio of 60 dB or higher is achieved when the Ta film thickness of the acoustic high impedance film 13b is 0.015 to 0.085 wavelength, 0.105 to 0.183 wavelength, and 0.216 to 0.275 wavelength, an impedance ratio of 65 dB or higher is achieved when the Ta film thickness is 0.018 to 0.08 wavelength, 0.107 to 0.175 wavelength, and 0.22 to 0.27 wavelength, an impedance ratio of 70 dB or higher is achieved when the Ta film thickness is 0.02 to 0.075 wavelength, 0.115 to 0.165 wavelength, and 0.225 to 0.26 wavelength, and an impedance ratio of 75 dB or higher is achieved when the Ta film thickness is 0.034 to 0.065 wavelength. FIG. 22(a) shows an example in which the SiO$_2$ film thickness is 0.05 wavelength; when the SiO$_2$ film thickness was 0.015 to 0.085 wavelength, an optimum Ta film thickness was the same as the film thickness observed when the SiO$_2$ film thickness was 0.05 wavelength.

Moreover, as shown in FIG. 22(b), it has been confirmed that an impedance ratio of 60 dB or higher is achieved when the SiO$_2$ film thickness of the acoustic low impedance film 13a is 0.015 to 0.085 wavelength, 0.118 to 0.18 wavelength, and 0.216 to 0.275 wavelength, an impedance ratio of 65 dB or higher is achieved when the SiO$_2$ film thickness is 0.017 to 0.093 wavelength, 0.122 to 0.175 wavelength, and 0.22 to 0.27 wavelength, an impedance ratio of 70 dB or higher is achieved when the SiO$_2$ film thickness is 0.02 to 0.087 wavelength, 0.13 to 0.17 wavelength, and 0.225 to 0.26 wavelength, and an impedance ratio of 75 dB or higher is achieved when the SiO$_2$ film thickness is 0.035 to 0.08 wavelength. FIG. 20(b) shows an example in which the Ta film thickness is 0.05 wavelength; when the Ta film thickness was 0.015 to 0.085 wavelength, an optimum SiO$_2$ film thickness was the same as the film thickness observed when the Ta film thickness was 0.05 wavelength.

Figure 23:
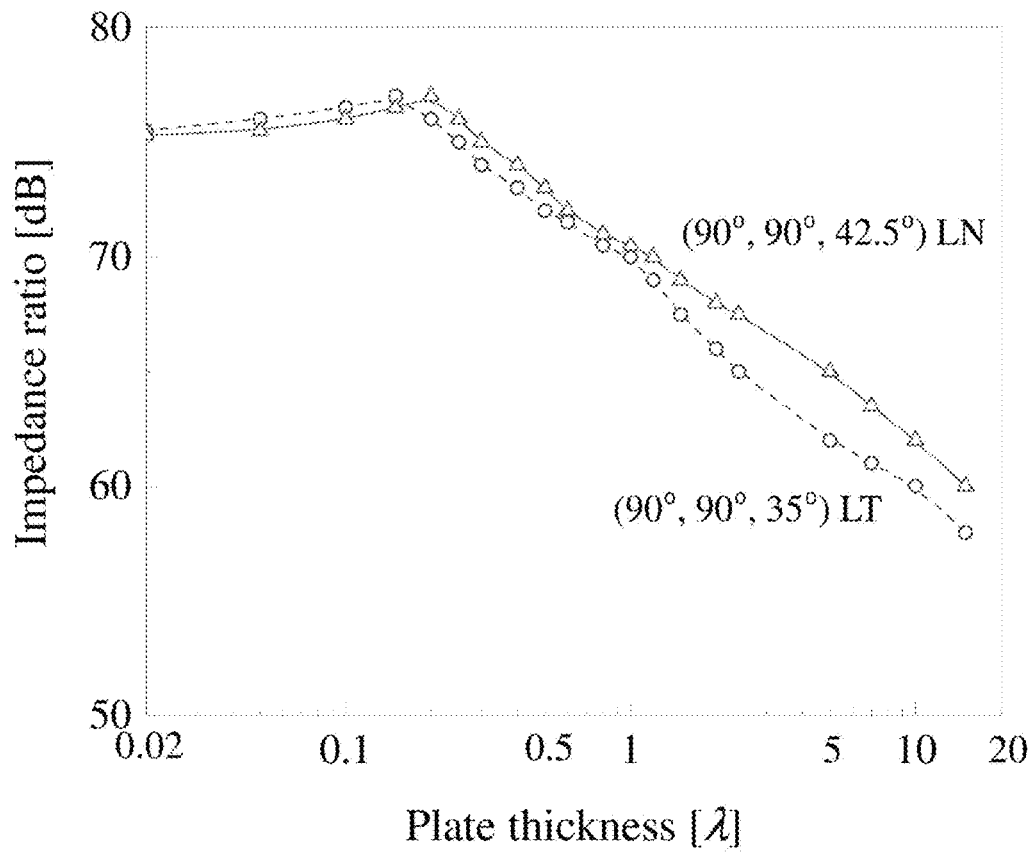
FIG. 23 is a graph showing the relationship between the impedance ratio and the thickness (Plate thickness) of a piezoelectric substrate in a structure of the acoustic wave device shown in FIG. 1(b) with Cu (0.1λ)/(90°, 90°, 42.5°) LN (0.2λ)/a floating electrode/SiO$_2$ (0.05λ)/Ta (0.05λ)/SiO$_2$ (0.05λ)/Ta (0.05λ)/SiO$_2$ (0.05λ)/Ta (0.05λ)/a Si substrate and a structure with Cu (0.1λ)/(90°, 90°, 35°) LT (0.15λ)/a floating electrode/SiO$_2$ (0.05λ)/Ta (0.05λ)/SiO$_2$ (0.05λ)/Ta (0.05λ)/SiO$_2$ (0.05λ)/Ta (0.05λ)/a Si substrate.

The dependence of the impedance ratio on the thickness of the piezoelectric substrate 11 observed when the acoustic wave device 10 shown in FIG. 1(b) had Cu (0.1λ)/(90°, 90°, 42.5°) LN (0.2λ)/a floating electrode/a SiO$_2$ film (0.05λ)/a Ta film (0.05λ)/a SiO$_2$ film (0.05λ)/a Ta film (0.05λ)/a SiO$_2$ film (0.05λ)/a Ta film (0.05λ)/a Si substrate and Cu (0.1λ)/ (90°, 90°, 35°) LT (0.15λ)/a floating electrode/a SiO$_2$ film (0.05λ)/a Ta film (0.05λ)/a SiO$_2$ film (0.05λ)/a Ta film (0.05λ)/a SiO$_2$ film (0.05λ)/a Ta film (0.05λ)/a Si substrate is shown in FIG. 23. As shown in FIG. 23, it has been confirmed that an impedance ratio of 65 dB or higher is achieved when the thickness of LN and the thickness of LT are 5 wavelength or less and 2.4 wavelength or less, respectively, an impedance ratio of 70 dB or higher is achieved when the thickness of LN and the thickness of LT are 1.2 wavelength or less and 1 wavelength or less, respectively, and an impedance ratio of 75 dB or higher is achieved when the thickness of LN and the thickness of LT are 0.3 to 0.02 wavelength and 0.25 to 0.02 wavelength, respectively.

Figure 24:
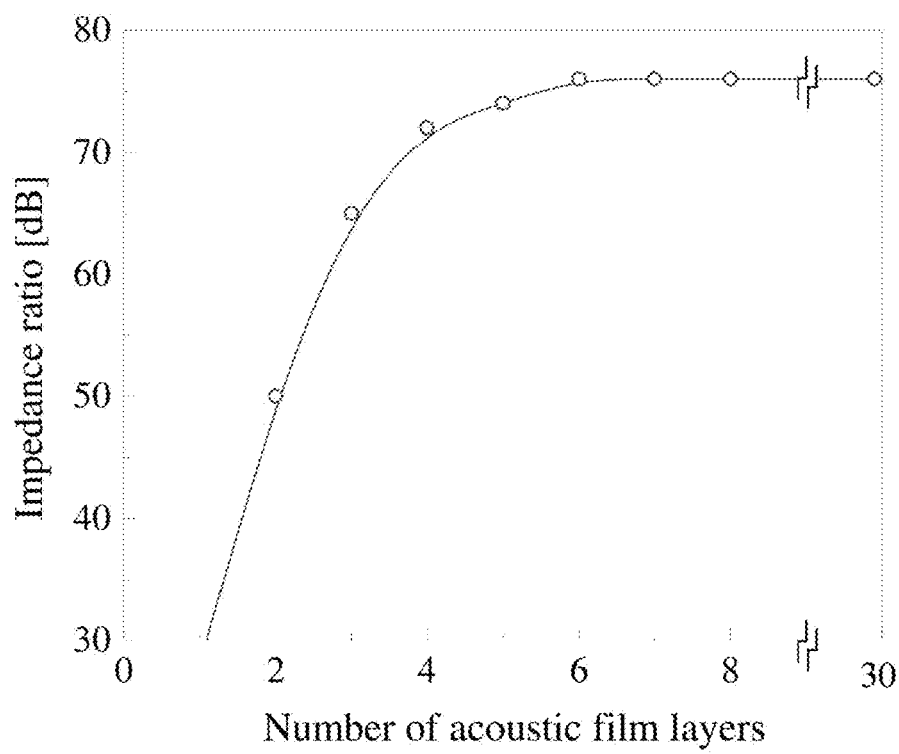
FIG. 24 is a graph showing the relationship between the impedance ratio and the number of layers of an acoustic multilayer film (Number of acoustic film layers) in a structure of the acoustic wave device shown in FIG. 1(b) with Cu (0.1λ)/(90°, 90°, 35°) LT (0.15λ)/a floating electrode/SiO$_2$ (0.05λ)/Ta (0.05λ)/SiO$_2$ (0.05λ)/Ta (0.05λ)/SiO$_2$ (0.05λ)/Ta (0.05λ)/a Si substrate.

The dependence of the impedance ratio on the number of layers of the acoustic multilayer film 13 observed when the acoustic wave device 10 shown in FIG. 1(b) had Cu (0.1λ)/ (90°, 90°, 35°) LT (0.15λ)/a floating electrode/a SiO$_2$ film (0.05λ)/a Ta film (0.05λ)/a SiO$_2$ film (0.05λ)/a Ta film (0.05λ)/a SiO$_2$ film (0.05λ)/a Ta film (0.05λ)/a Si substrate is shown in FIG. 24. As shown in FIG. 24, it has been confirmed that an impedance ratio of 65 dB is achieved when the acoustic multilayer film 13 is composed of three layers, an impedance ratio of 72 dB is achieved when the acoustic multilayer film 13 is composed of four layers, an impedance ratio of 74 dB is achieved when the acoustic multilayer film 13 is composed of five layers, and an impedance ratio of 76 dB is achieved when the acoustic multilayer film 13 is composed of 6 to 30 layers. It is to be noted that a film such as Ti which is provided to enhance adhesion strength at the time of film formation of each film of the acoustic multilayer film 13 is not counted as an acoustic impedance film because the film such as Ti has a film thickness of a few tens to hundreds of nm and is relatively very thin compared to each film of the acoustic multilayer film 13.

Figure 25:
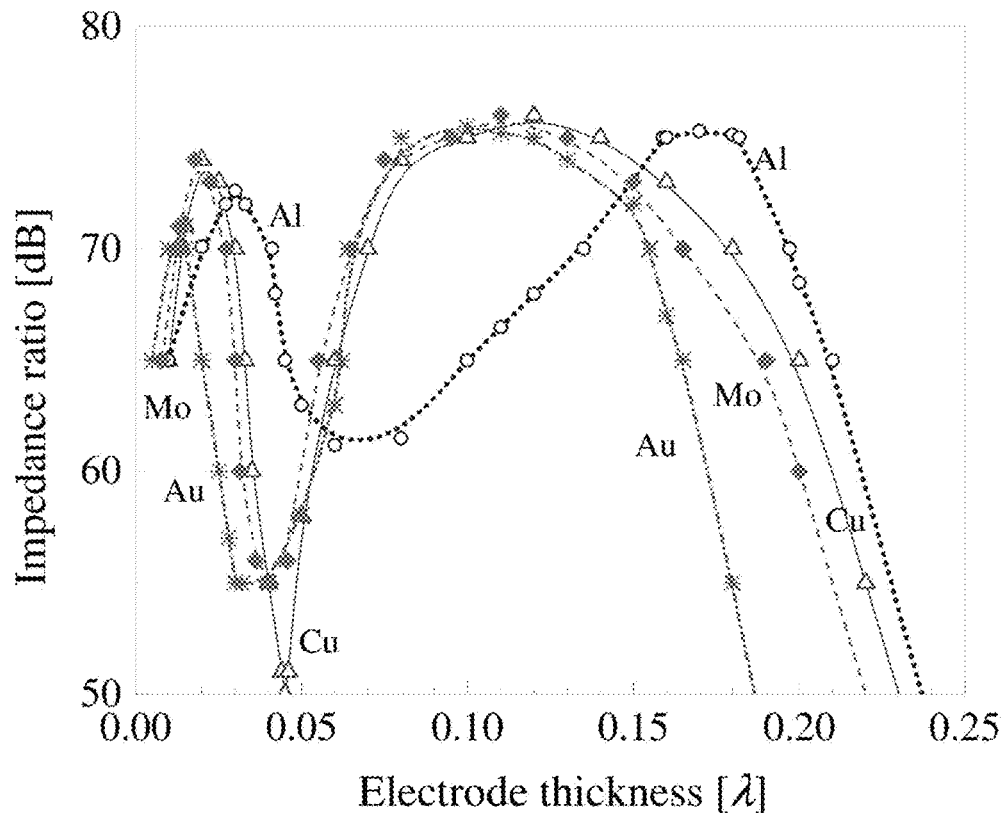
FIG. 25 is a graph showing the relationship between the impedance ratio and the thickness (Electrode thickness) of each interdigital transducer when MR=0.5 in a structure of the acoustic wave device shown in FIG. 1(b) with an interdigital transducer/(90°, 90°, 35°) LT (0.15λ)/a floating electrode/SiO$_2$ (0.05λ)/Ta (0.05λ)/SiO$_2$ (0.05λ)/Ta (0.05λ)/SiO$_2$ (0.05λ)/Ta (0.05λ)/a Si substrate.

The dependence of the impedance ratio on the thickness of the electrode 12 of the interdigital transducer 12a observed when the acoustic wave device 10 shown in FIG. 1(b) had the interdigital transducer 12a/(90°, 90°, 35°) LT (0.15λ)/a floating electrode/a SiO$_2$ film (0.05λ)/a Ta film (0.05λ)/a SiO$_2$ film (0.05λ)/a Ta film (0.05λ)/a SiO$_2$ film (0.05λ)/a Ta film (0.05λ)/a Si substrate is shown in FIG. 25. It is to be noted that FIG. 25 shows the results obtained when the metalization ratio (MR) of the interdigital transducer 12a was set at 0.5 and a Cu electrode, an Al electrode, a Au electrode, and a Mo electrode were used as the interdigital transducer 12a.

As shown in FIG. 25, it has been confirmed that, when a Cu electrode is used, an impedance ratio of 65 dB or higher is achieved when the electrode thickness is 0.01 to 0.033 wavelength and 0.06 to 0.2 wavelength, an impedance ratio of 70 dB or higher is achieved when the electrode thickness is 0.014 to 0.03 wavelength and 0.07 to 0.18 wavelength, and an impedance ratio of 75 dB or higher is achieved when the electrode thickness is 0.1 to 0.14 wavelength. Moreover, it has been confirmed that, when an Al electrode is used, an impedance ratio of 65 dB or higher is achieved when the electrode thickness is 0.01 to 0.045 wavelength and 0.1 to 0.21 wavelength, an impedance ratio of 70 dB or higher is achieved when the electrode thickness is 0.02 to 0.041 wavelength and 0.135 to 0.197 wavelength, and an impedance ratio of 75 dB or higher is achieved when the electrode thickness is 0.159 to 0.182 wavelength.

Furthermore, it has been confirmed that, when a Au electrode is used, an impedance ratio of 65 dB or higher is achieved when the electrode thickness is 0.005 to 0.02 wavelength and 0.062 to 0.165 wavelength, an impedance ratio of 70 dB or higher is achieved when the electrode thickness is 0.01 to 0.0152 wavelength and 0.064 to 0.155 wavelength, and an impedance ratio of 75 dB or higher is achieved when the electrode thickness is 0.08 to 0.12 wavelength. Moreover, it has been confirmed that, when a Mo electrode is used, an impedance ratio of 65 dB or higher is achieved when the electrode thickness is 0.008 to 0.03 wavelength and 0.055 to 0.19 wavelength, an impedance ratio of 70 dB or higher is achieved when the electrode thickness is 0.0125 to 0.027 wavelength and 0.065 to 0.165 wavelength, and an impedance ratio of 75 dB or higher is achieved when the electrode thickness is 0.095 to 0.13 wavelength.

It is to be noted that the optimum thickness of the interdigital transducer 12a is the same electrode thickness as the Al electrode when the density of the interdigital transducer 12a is 1800 kg/m³ or more and less than 6000 kg/m³, the optimum thickness is the same electrode thickness as the Cu electrode when the density is 6000 kg/m³ or more and less than 10000 kg/m³, the optimum thickness is the same electrode thickness as the Mo electrode when the density is 10000 kg/m³ or more and less than 15000 kg/m³, and the optimum thickness is the same electrode thickness as the Au electrode when the density is 15000 kg/m³ or more and less than 25000 kg/m³. When the interdigital transducer 12a is made of an alloy or a multilayer metal film, the optimum thickness is determined by conversion using the mean density thereof. When the metalization ratio (MR) of the interdigital transducer 12a deviates from 0.5, the optimum thickness is given by H×0.5/MR where H is the optimum thickness when the MR is 0.5.

Figure 26:
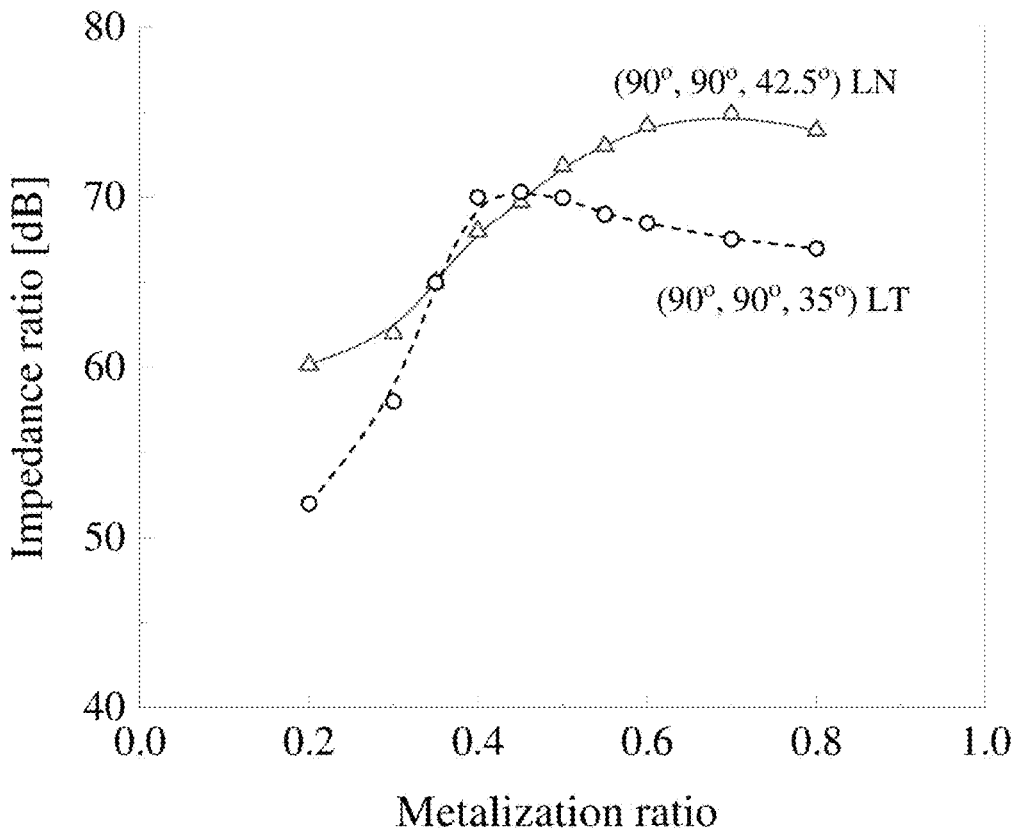
FIG. 26 is a graph showing the relationship between the impedance ratio and the metalization ratio of the interdigital transducer in a structure of the acoustic wave device shown in FIG. 1(b) with Cu (0.1λ)/(90°, 90°, 42.5°) LN (0.2λ)/a floating electrode/SiO$_2$ (0.05λ)/Ta (0.05λ)/SiO$_2$ (0.05λ)/Ta (0.05λ)/SiO$_2$ (0.05λ)/Ta (0.05λ)/a Si substrate and a structure with Cu (0.1λ)/(90°, 90°, 35°) LT (0.15λ)/a floating electrode/SiO$_2$ (0.05λ)/Ta (0.05λ)/SiO$_2$ (0.05λ)/Ta (0.05λ)/SiO$_2$ (0.05λ)/Ta (0.05λ)/a Si substrate.
Figure 27:
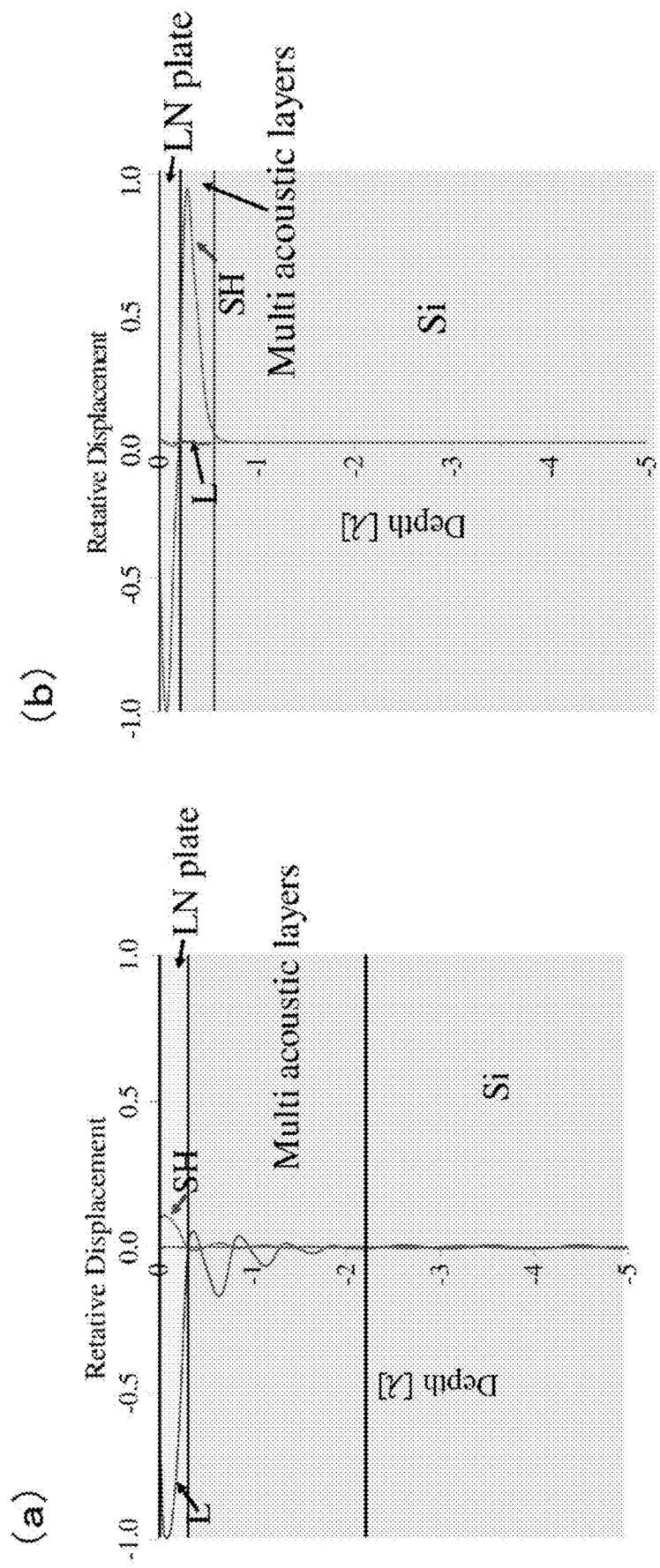
FIG. 27(a) is a graph showing the LLSAW displacement distribution in a structure with Al (0.05λ)/(90°, 90°, 40°) LN (0.2λ)/SiO$_2$ (0.25λ)/Ta (0.25λ)/SiO$_2$ (0.25λ)/Ta (0.25λ)/SiO$_2$ (0.25λ)/Ta (0.25λ)/SiO$_2$ (0.25λ)/Ta (0.25λ)/a Si substrate, which corresponds to the acoustic wave device shown in Patent Literature 3.
FIG. 27(b) is a graph showing the overtone SAW displacement distribution in a structure of the acoustic wave device shown in FIG. 1(a) with Cu (0.1λ)/(90°, 90°, 42.5°) LN (0.2λ)/SiO$_2$ (0.05λ)/Ta (0.05λ)/SiO$_2$ (0.05λ)/Ta (0.05λ)/SiO$_2$ (0.05λ)/Ta (0.05λ)/SiO$_2$ (0.05λ)/Ta (0.05λ)/a Si substrate.

The dependence of the impedance ratio on the MR of the interdigital transducer 12a observed when the acoustic wave device 10 shown in FIG. 1(b) had Cu (0.1λ)/(90°, 90°, 42.5°) LN (0.2λ)/a floating electrode/a SiO₂ film (0.05λ)/a Ta film (0.05λ)/a SiO₂ film (0.05λ)/a Ta film (0.05λ)/a SiO₂ film (0.05λ)/a Ta film (0.05λ)/a Si substrate and Cu (0.1λ)/(90°, 90°, 35°) LT (0.15λ)/a floating electrode/a SiO₂ film (0.05λ)/a Ta film (0.05λ)/a SiO₂ film (0.05λ)/a Ta film (0.05λ)/a SiO₂ film (0.05λ)/a Ta film (0.05λ)/a Si substrate is shown in FIG. 26. As shown in FIG. 26, it has been confirmed that an impedance ratio of 65 dB or higher is achieved with both LN and LT when the MR is 0.35 to 0.8. Moreover, it has been confirmed that an impedance ratio of 70 dB or higher is achieved with LN when the MR is 0.45 to 0.8 and an impedance ratio of 68 dB or higher is achieved with LT when the MR is 0.45 to 0.6.

[Comparison with Patent Literature 3]

A response excited near 5.1 GHz, which is shown in FIG. 3(a), has a velocity of 6,100 m/s and corresponds to a LLSAW. In contrast to this, although a LLSAW is excited using the Al electrodes having thicknesses of 0.05, 0.06, and 0.08 wavelength in Patent Literature 3, it is impossible to excite an overtone of a SAW greatly with these Al electrode thicknesses as shown in FIG. 25.

Moreover, the displacement distribution of the frequency response at a velocity of 6,200 m/s, which corresponds to a LLSAW, in a structure with Al (0.05λ)/0.2 wavelength (90°, 90°, 40°) LN (0.2λ)/an acoustic multilayer film [Multi acoustic layers; SiO₂ (0.25λ)/Ta (0.25λ)/SiO₂ (0.25λ)/Ta (0.25λ)/SiO₂ (0.25λ)/Ta (0.25λ)/SiO₂ (0.25λ)/Ta (0.25λ)]/a Si substrate, which corresponds to the acoustic wave device shown in Patent Literature 3, is shown in FIG. 27(a). As shown in FIG. 27(a), it has been confirmed that the displacement distribution mainly contains a longitudinal wave component ("L" in the drawing) and vibration that is exited is a LLSAW shown in Patent Literature 3.

On the other hand, the displacement distribution of the frequency response of an overtone near a velocity of 11,000 m/s observed when the acoustic wave device 10 shown in FIG. 1(a) had Cu (0.1λ)/(90°, 90°, 42.5°) LN (0.2λ)/an acoustic multilayer film [Multi acoustic layers; SiO₂ (0.05λ)/Ta (0.05λ)/SiO₂ (0.05λ)/Ta (0.05λ)/SiO₂ (0.05λ)/Ta (0.05λ)/SiO₂ (0.05λ)/Ta (0.05λ)]/a Si substrate is shown in FIG. 27(b). As shown in FIG. 27(b), it has been confirmed that the displacement distribution is a SAW whose major component is an SH component. As described above, it is clear that, since the acoustic wave device of Patent Literature 3 and the acoustic wave device 10 of the embodiment of the present invention have completely different displacement distributions in addition to the difference in the frequency and velocity and the difference between the fundamental mode of a LLSAW and an overtone of a SAW, they also differ in the mode of vibration.

REFERENCE SIGNS LIST

10: Acoustic wave device
11: Piezoelectric substrate
12: Electrode
   12a: Interdigital transducer
   12b: Floating electrode
13: Acoustic multilayer film
   13a: Acoustic low impedance film
   13b: Acoustic high impedance film
14: Support substrate

What is claimed is:

1. An acoustic wave device comprising:
a piezoelectric substrate;
an electrode provided in such a way as to be in contact with the piezoelectric substrate; and
an acoustic multilayer film provided in such a way as to be in contact with the piezoelectric substrate and/or the electrode, wherein
the acoustic multilayer film includes an acoustic film composed of a first acoustic impedance film and a second acoustic impedance film which are alternately and continuously stacked in three layers or more and twenty layers or less, the first acoustic impedance film having a lower impedance than the second acoustic impedance film,
the acoustic multilayer film is configured to excite an overtone of resonance characteristics of a surface acoustic wave,
the acoustic wave device uses the overtone, and
a thickness of each of at least three layers of the first acoustic impedance films and the second acoustic impedance films of the acoustic multilayer film is 0.012 to 0.118 wavelength, 0.105 to 0.2 wavelength, or 0.216 to 0.275 wavelength of the surface acoustic wave.

2. The acoustic wave device according to claim 1,
wherein the electrode includes an interdigital transducer provided on one of surfaces of the piezoelectric substrate,
wherein the acoustic multilayer film is provided in such a way as to be in contact with the other of the surfaces of the piezoelectric substrate, and
wherein the piezoelectric substrate is made of a LiNbO₃ crystal and has Euler angles (−30° to 30°, 60° to 103°, −15° to 15°) or (90°±6°, 90°±6°, −20° to 48°) or Euler angles crystallographically equivalent to the Euler angles (−30° to 30°, 60° to 103°, −15° to 15°) or (90°±6°, 90°±6°, −20° to 48°).

3. The acoustic wave device according to claim 2,
wherein a thickness of the piezoelectric substrate is 0.002 to 5 wavelength of the surface acoustic wave.

4. The acoustic wave device according to claim 2,
wherein, when MR represents a metalization ratio and λ represents a wavelength of the surface acoustic wave, a thickness of the interdigital transducer is (0.01λ to 0.045λ)×0.5/MR or (0.1λ to 0.21λ)×0.5/MR when a density thereof is 1800 kg/m³ or more and less than 6000 kg/m³, a thickness of the interdigital transducer is (0.01λ to 0.033λ)×0.5/MR or (0.06λ to 0.2λ)×0.5/MR when a density thereof is 6000 kg/m³ or more and less than 10000 kg/m³, a thickness of the interdigital transducer is (0.008λ to 0.03λ)×0.5/MR or (0.055λ to 0.19λ)×0.5/MR when a density thereof is 10000 kg/m³ or more and less than 15000 kg/m, or a thickness of the interdigital transducer is (0.005λ to 0.02λ)×0.5/MR or (0.062λ to 0.165λ)×0.5/MR when a density thereof is 15000 kg/m³ or more and less than 25000 kg/m³.

5. The acoustic wave device according to claim 2, wherein a metalization ratio of the interdigital transducer is 0.35 or more.

6. The acoustic wave device according to claim 1, wherein the electrode includes an interdigital transducer provided on one of surfaces of the piezoelectric substrate,
wherein the acoustic multilayer film is provided in such a way as to be in contact with the other of the surfaces of the piezoelectric substrate, and
wherein the piezoelectric substrate is made of a LiTaO₃ crystal and has Euler angles (−30° to 30°, 55° to 100°, −15 to 15°), (90°±6°, 90°±6°, −5° to 61°), or (90°±6°, 90°±6°, 83° to 93°) or Euler angles crystallographically equivalent to the Euler angles (−30 to 30°, 55 to 100°, −15 to 15°), (90°±6°, 90°±6°, −5 to 61°), or (90°±6°, 90°±6°, 83° to 93°).

7. The acoustic wave device according to claim 6, wherein a thickness of the piezoelectric substrate is 0.002 to 2.4 wavelength of the surface acoustic wave.

8. The acoustic wave device according to claim 1, wherein the surface acoustic wave that is the overtone corresponds to a velocity of 9000 m/s or higher.

9. The acoustic wave device according to claim 1, wherein each first acoustic impedance film and/or each second acoustic impedance film of the acoustic multilayer film is made of a film containing at least one of a Mg alloy, SiO₂, SiOF, Al, Y, Si, Ge, Ti, ZnO, Si$_x$N$_y$ (where x and y are positive real numbers), AlN, SiC, Al₂O₃, Ag, ZrO₂, Hf, Cu, TiO₂, Cr, Ni, Au, Ta, Mo, Pt, and W or an oxide film, a nitride film, a carbide film, or an iodide film containing at least one of these materials.

10. The acoustic wave device according to claim 1, wherein a thickness of at least one layer of the first acoustic impedance films of the acoustic multilayer film is 0.012 to 0.118 wavelength of the surface acoustic wave and a thickness of at least one layer of the second acoustic impedance films is 0.015 to 0.108 wavelength, 0.109 to 0.12 wavelength, or 0.216 to 0.275 wavelength of the surface acoustic wave.

11. The acoustic wave device according to claim 1, wherein a thickness of at least one layer of the second acoustic impedance films of the acoustic multilayer film is 0.015 to 0.108 wavelength of the surface acoustic wave and a thickness of each of at least two layers of the first acoustic impedance films is 0.015 to 0.118 wavelength, 0.119 to 0.2 wavelength, or 0.216 to 0.275 wavelength of the surface acoustic wave.

12. The acoustic wave device according to claim 1, wherein the piezoelectric substrate is made of a monocrystal of LiNbO₃ or LiTaO₃.

13. The acoustic wave device according to claim 1, wherein the electrode includes an interdigital transducer provided on one of surfaces of the piezoelectric substrate and a floating electrode provided in such a way as to cover the other of the surfaces of the piezoelectric substrate,
wherein the acoustic multilayer film is provided in such a way as to be in contact with a surface of the floating electrode on a side thereof opposite to the piezoelectric substrate, and
wherein the piezoelectric substrate is made of a LiNbO₃ crystal and has Euler angles (−30° to 30°, 64° to 98°, −15° to 15°) or (90°±6°, 90°±6°, −4° to 56°) or Euler angles crystallographically equivalent to the Euler angles (−30° to 30°, 64° to 98°, −15° to 15°) or (90°±6°, 90°±6°, −4° to 56°).

14. The acoustic wave device according to claim 1, wherein the electrode includes an interdigital transducer provided on one of surfaces of the piezoelectric substrate and a floating electrode provided in such a way as to cover the other of the surfaces of the piezoelectric substrate,
wherein the acoustic multilayer film is provided in such a way as to be in contact with a surface of the floating electrode on a side thereof opposite to the piezoelectric substrate, and
wherein the piezoelectric substrate is made of a LiTaO₃ crystal and has Euler angles (−30° to 30°, 65 to 94°, −15 to 15°) or (90°±6°, 90°±6°, −4° to 56°) or Euler angles crystallographically equivalent to the Euler angles (−30° to 30°, 65° to 94°, −15° to 15°) or (90°±6°, 90°±6°, −4° to 56°).

15. The acoustic wave device according to claim 1, wherein
the electrode includes a plurality of electrode fingers arranged with gaps between adjacent electrode fingers, and
the wavelength of the surface acoustic wave is determined based on a period of the electrode fingers.

\* \* \* \* \*